US010587737B2

(12) United States Patent
Yoo et al.

(10) Patent No.: US 10,587,737 B2
(45) Date of Patent: Mar. 10, 2020

(54) MOBILE TERMINAL

(71) Applicant: LG ELECTRONICS INC., Seoul (KR)

(72) Inventors: Kyungsu Yoo, Seoul (KR); Kidoo Han, Seoul (KR); Bohyoung Lee, Seoul (KR); Minho Park, Seoul (KR); Hyunghoon Oh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/089,346

(22) PCT Filed: Sep. 20, 2016

(86) PCT No.: PCT/KR2016/010441
§ 371 (c)(1),
(2) Date: Sep. 27, 2018

(87) PCT Pub. No.: WO2017/171161
PCT Pub. Date: Oct. 5, 2017

(65) Prior Publication Data
US 2019/0132430 A1    May 2, 2019

(30) Foreign Application Priority Data

Mar. 28, 2016  (KR) .......................... 10-2016-0037026
Aug. 19, 2016  (KR) .......................... 10-2016-0105448

(51) Int. Cl.
*H04M 1/02* (2006.01)
*H05K 1/02* (2006.01)
(Continued)

(52) U.S. Cl.
CPC .......... *H04M 1/0249* (2013.01); *H01Q 1/243* (2013.01); *H01Q 9/30* (2013.01);
(Continued)

(58) Field of Classification Search
CPC ............ H04M 1/0249; H04M 1/0274; H04M 1/0262; H05K 1/028; H01Q 1/243;
(Continued)

(56) References Cited

U.S. PATENT DOCUMENTS 9,160,058 B2 * 10/2015 Tsou .................... H01Q 1/2266
2012/0176278 A1 * 7/2012 Merz ...................... H01Q 1/243
343/702
(Continued)

FOREIGN PATENT DOCUMENTS

KR   10-2014-0020670   2/2014
KR   10-2014-0037687   3/2014
(Continued)

OTHER PUBLICATIONS

PCT International Application No. PCT/KR2016/010441, International Search Report dated Jan. 10, 2017, 2 pages.

*Primary Examiner* — Lee Nguyen
(74) *Attorney, Agent, or Firm* — Lee, Hong, Degerman, Kang & Waimey PC

(57) ABSTRACT

The present invention relates to a mobile terminal including: a terminal body; a front case formed so as to cover the front surface of the terminal body; a rear case provided at the rear surface of the front case; a side case, which is made from a metal material, forms the side exterior of the terminal body, is integrally formed, and has both end portions thereof spaced so as to face each other such that a single slit is formed; a main circuit board provided on the terminal body; a first power supply part connected to the main circuit board, and provided at one side of the single slit so as to supply power to the side case; a second power supply part, and provided at the other side of the single slit so as to supply the power to the side case; and a conductive member.

21 Claims, 15 Drawing Sheets

(51) Int. Cl.
*H01Q 21/28* (2006.01)
*H01Q 1/24* (2006.01)
*H01Q 9/30* (2006.01)

(52) U.S. Cl.
CPC .......... *H01Q 21/28* (2013.01); *H04M 1/0262* (2013.01); *H04M 1/0274* (2013.01); *H04M 1/0277* (2013.01); *H05K 1/028* (2013.01)

(58) Field of Classification Search
CPC .. H01Q 1/38; H01Q 1/48; H01Q 1/50; H01Q 5/35; H01Q 5/50; H01Q 7/00
USPC ........................................ 455/575.1; 343/702
See application file for complete search history.

(56) References Cited

U.S. PATENT DOCUMENTS

2014/0078008 A1* 3/2014 Kang ....................... H01Q 5/35
343/702
2014/0210675 A1 7/2014 Hwang et al.

FOREIGN PATENT DOCUMENTS

KR 10-2015-0068201 6/2015
KR 10-2015-0117161 10/2015

* cited by examiner

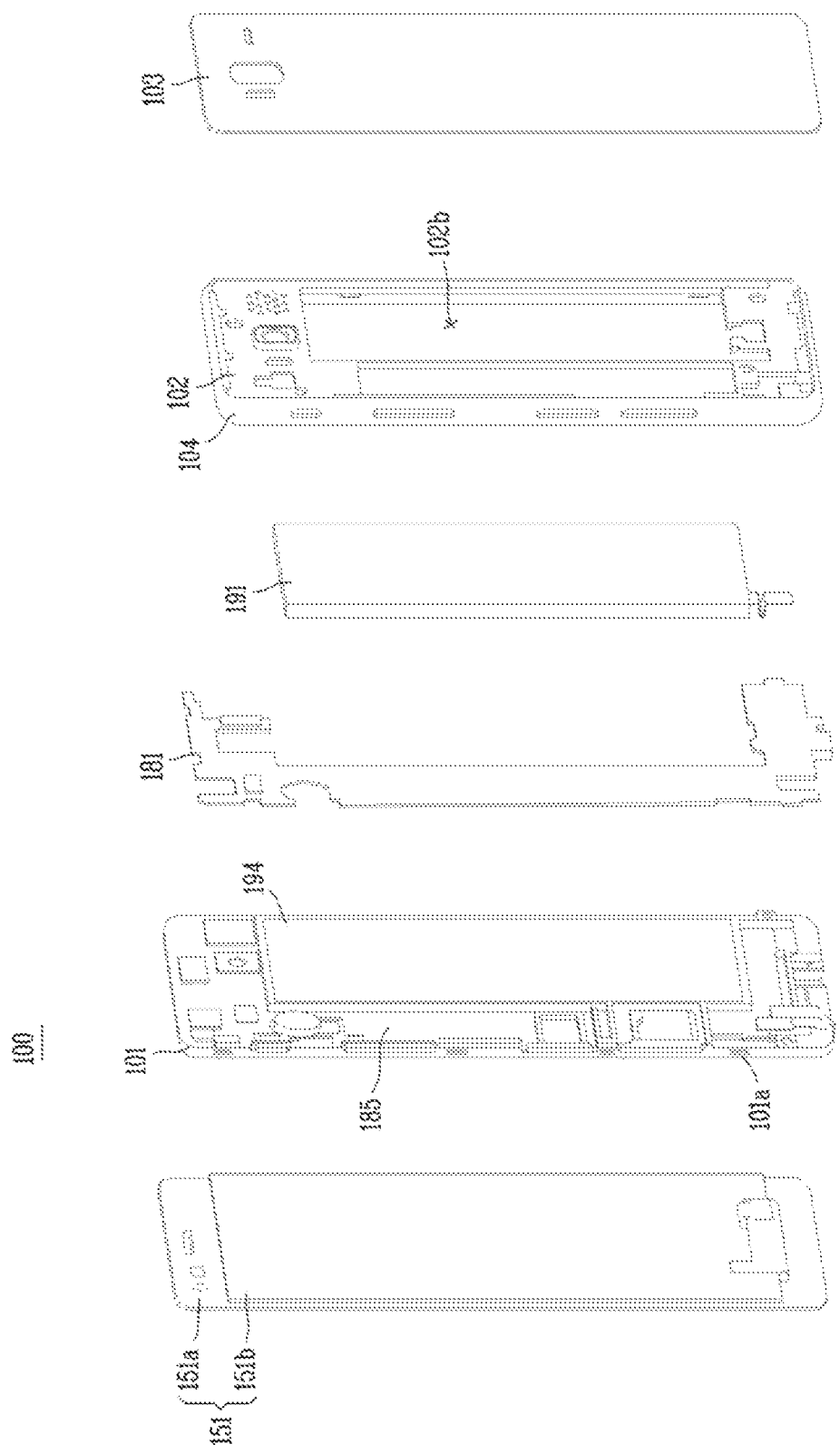

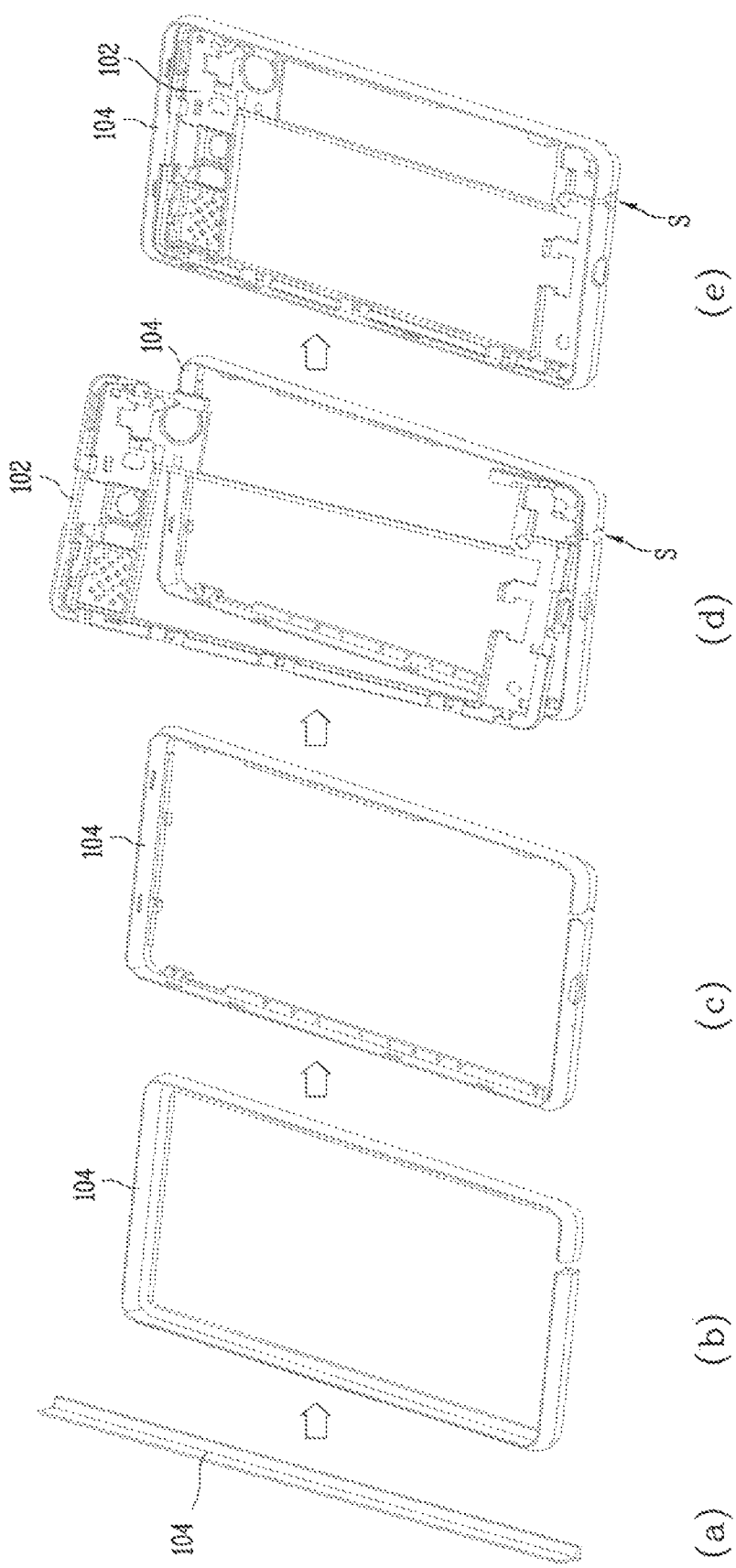

MOBILE TERMINAL

CROSS-REFERENCE TO RELATED APPLICATIONS

This application is the National Stage filing under 35 U.S.C. 371 of International Application No. PCT/KR2016/010441, filed on Sep. 20, 2016, which claims the benefit of earlier filing date and right of priority to Korean Application Nos. 10-2016-0037026, filed on Mar. 28, 2016, and 10-2016-0105448, filed on Aug. 19, 2016, the contents of which are all hereby incorporated by reference herein in their entirety.

BACKGROUND OF THE INVENTION

1. Field of the Invention

The present disclosure relates to a mobile terminal having a single slit on a side surface thereof.

2. Description of the Related Art

Terminals may be divided into mobile/portable terminals and stationary terminals according to their mobility. Furthermore, mobile terminals may be divided into handheld terminals and vehicle mounted terminals according to whether or not it can be directly carried by a user.

The functions of mobile terminals have been diversified. For example, the functions may include data and voice communication, photographing and video shooting through a camera, voice recording, playing a music file through a speaker system, and displaying an image or video on a display unit. Some terminals further include an electronic game play function or perform a multimedia player function. In particular, in recent years, mobile terminals may receive multicast signals that provide visual content such as broadcast, video or television programs.

As it becomes multifunctional, for example, such a terminal is allowed to capture still images or moving images, play music or video files, play games, receive broadcast and the like, so as to be implemented as an integrated multimedia player.

In recent years, technologies for forming an antenna through forming a body using metal have been developed. However, when the antenna is operated by implementing a metal body, a plurality of slits are required.

When a plurality of slits are formed in this manner, there is a problem that is harmful to the appearance design, and there is a problem of weakening rigidity due to a structure in which the metal is segmented.

SUMMARY OF THE INVENTION

An object of the present disclosure is to solve the above-mentioned problems and other problems. Another object of the present disclosure is to provide a mobile terminal in which a metal case forming a side of the terminal forms a single slit.

In order to accomplish the foregoing and other objects, according to an aspect of the present disclosure, there is provided a mobile terminal, including a terminal body; a front case formed to cover a front surface of the terminal body; a rear case provided on a rear surface of the front case; a side case made of a metal material, and integrally formed to form a side appearance of the terminal body, both end portions of which are spaced apart to face each other to form a single slit; a main circuit board provided in the terminal body; a first power feeder connected to the main circuit board and provided at one side of the single slit to feed power to the side case; a second power feeder connected to the main circuit board and provided at the other side of the single slit to feed power to the side case; and a conductive member branched from one point between the first power feeder and the single slit, one end portion of which forms a free end, wherein a first conductive loop is formed on a path along the side case, the single slit, and the conductive member from the second power feeder, and a second conductive loop is formed on a path along the conductive member through the side case from the first power feeder.

According to an aspect of the present disclosure, the mobile terminal may include a first ground portion formed adjacent to the first power feeder and grounded to a ground (GND); and a second ground portion formed adjacent to the second power feeder and grounded to the ground.

According to an aspect of the present disclosure, the side case may include a first portion formed at a lower end of the terminal body; a second portion extended from the first portion and formed on one side of the terminal body; a third portion extended from the second portion and formed at an upper end of the terminal body; and a fourth portion extended from the third portion and formed on one side of the terminal body, wherein the single slit and the first power feeder are formed in the first portion, the second power feeder and the second ground portion are formed in the fourth portion, and the first ground portion is formed in the second portion.

According to an aspect of the present disclosure, the mobile terminal may further include a third conductive loop formed on a path connected to the first power feeder, the single slit and the second ground portion; and a fourth conductive loop formed on a path connected to the second power feeder, the single slit, and the first ground portion.

According to an aspect of the present disclosure, the side case may include an exposed portion exposed to the outside to form a side appearance of the terminal body; and a support portion extended from the exposed portion and inwardly protruded to be coupled to the rear case.

According to an aspect of the present disclosure, the mobile terminal may further include an intermediate frame made of a metal material provided in the front case, wherein the ground portion includes a flexible circuit board provided between the intermediate frame and the rear case; a first ground terminal formed on one surface of the flexible circuit board, and brought into contact with one surface of the support portion through a through hole formed on the rear case; and a second ground terminal formed on the other surface of the flexible circuit board and brought into contact with the intermediate frame.

According to an aspect of the present disclosure, a protrusion may be formed at a position corresponding to the through hole formed on the support portion in the rear case, and the protrusion may be passed through the through hole of the support portion and coupled to the support portion by thermal fusion, and the rear case may be coupled to the support portion by a screw at a portion adjacent to the single slit.

According to an aspect of the present disclosure, a plurality of hooks may be formed on an outer side surface of the front case, and the hooks may be inserted into grooves formed on an inner side surface of the side case to couple the front case to the side case.

According to an aspect of the present disclosure, the rear case and the front case may be fixed to the side case by screws passing through the support portion.

According to an aspect of the present disclosure, the support portion may be cut at a bent portion of the side case.

According to an aspect of the present disclosure, the single slit may be an ear jack hole or a USB port.

In order to accomplish the foregoing and other objects, according to an aspect of the present disclosure, there is provided a mobile terminal, including a front case in which a display unit is accommodated; a rear case provided on a rear surface of the front case; a side case configured to form an outer appearance while surrounding a side surface of the rear case; a rear cover configured to form a rear appearance while covering a rear surface of the rear case; a main circuit board provided between the rear case and the front case; a power feeder connected to the main circuit board to feed power to the side case at least one point of the side case; and a ground portion formed at least one point of the side case to allow the side case to be grounded to a ground (GND), wherein the side case is an integrally formed metal member, and both end portions thereof are spaced apart from each other to form a single slit at a lower end portion of the side case, and the side case formed adjacent to the single slit operates as a radiator of an antenna having at least one conductive loop by combination with the ground.

According to an aspect of the present disclosure, the power feeder may include a first power feeder provided on one side of the single slit; and a second power feeder provided on the other side of the single slit, and the ground portion may include a first ground portion formed adjacent to the first power feeder and grounded to the ground; and a second ground portion formed adjacent to the second power feeder and grounded to the ground.

According to an aspect of the present disclosure, the conductive loop may include a first loop (L1) passed through the first power feeder, the first ground portion, an edge of the ground (GND), the second ground portion and the second power feeder and formed up to the first power feeder through the single slit; a second loop (L2) passed through the side case from the first power feeder toward the single slit, and formed along a conductive member branched from one point between the first power feeder and the single slit; a third loop (L3) formed from the second power feeder toward the single slit, and formed along the single slit (S) and the conductive member; and a fourth loop (L4) formed from the second power feeder to the single slit through the side case.

According to an aspect of the present disclosure, the mobile terminal may further include an intermediate frame made of a metal material provided in the front case, wherein the ground portion includes a flexible circuit board provided between the intermediate frame and the rear case; a first ground terminal formed on one surface of the flexible circuit board, and brought into contact with one surface of the support portion through a through hole formed on the rear case; and a second ground terminal formed on the other surface of the flexible circuit board and brought into contact with the intermediate frame.

According to an aspect of the present disclosure, the side case may include an exposed portion exposed to the outside to form an appearance; and a support portion extended from the exposed portion and inwardly protruded to be coupled to the rear case.

According to an aspect of the present disclosure, a protrusion may be formed at a position corresponding to the through hole formed on the support portion in the rear case, and the protrusion may be passed through the through hole of the support portion and coupled to the support portion by thermal fusion, and the rear case may be coupled to the support portion by a screw at a portion adjacent to the single slit.

According to an aspect of the present disclosure, a plurality of hooks may be formed on an outer side surface of the front case, and the hooks may be inserted into grooves formed on an inner side surface of the side case to couple the front case to the side case.

According to an aspect of the present disclosure, the rear case and the front case may be fixed to the side case by screws passing through the support portion.

According to an aspect of the present disclosure, the support portion may be cut at a bent portion of the side case.

According to an aspect of the present disclosure, the single slit may be an ear jack hole.

The effects of a mobile terminal according to the present disclosure will be described as follows.

According to at least one of the embodiments of the present disclosure, the metal case may form a single slit, thereby improving mechanical rigidity.

Furthermore, according to at least one of the embodiments of the present disclosure, the metal case may be partially cut at a bent portion of the metal case, thereby allowing the metal case to be easily bent.

In addition, according to at least one of the embodiments of the present disclosure, the single slit may be formed using a case forming a side appearance of the terminal, thereby allowing the side case to be used as a radiator of the antenna, and forming a plurality of loops using the single slit.

Further scope of applicability of the present disclosure will become apparent from the detailed description given hereinafter. However, it should be understood that the detailed description and specific examples such as preferred embodiments of the invention are given by way of illustration only, since various changes and modifications within the spirit and scope of the invention will become apparent to those skilled in the art from this detailed description.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings:

FIG. 2 is an exploded view illustrating a mobile terminal according to an embodiment of the present disclosure;

FIGS. 3A and 3B are views illustrating a process of coupling a rear case to a side case according to an embodiment of the present disclosure;

DETAILED DESCRIPTION OF THE INVENTION

Figure 1A:
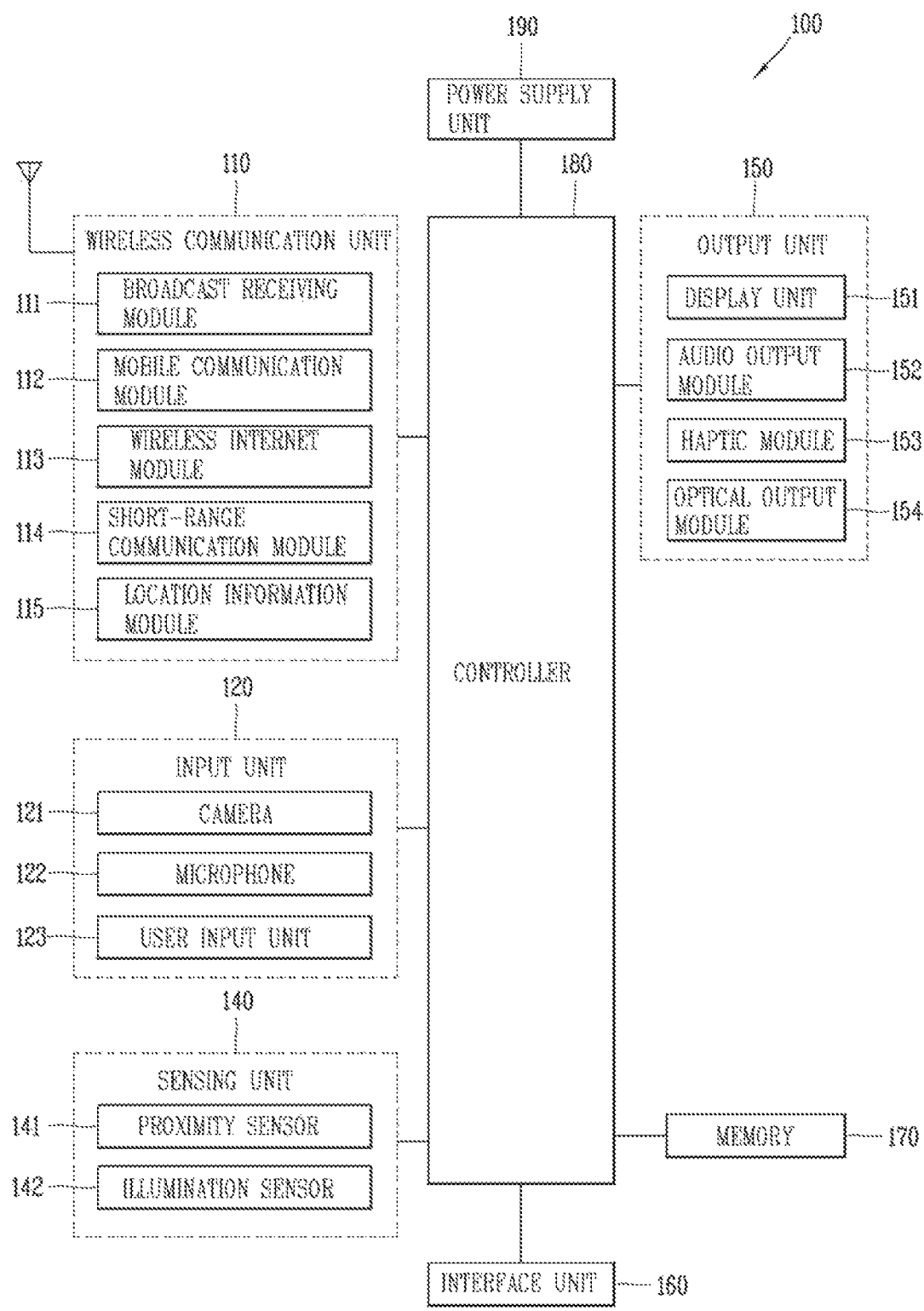
FIG. 1A is a block diagram for explaining a mobile terminal associated with the present disclosure.

Hereinafter, preferred embodiments of the present disclosure will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. On the contrary, in case where an element is "directly connected" or "directly linked" to another element, it should be understood that any other element is not existed therebetween.

A singular representation may include a plural representation as far as it represents a definitely different meaning from the context.

Terms "include" or "has" used herein should be understood that they are intended to indicate an existence of several components or several steps, disclosed in the specification, and it may also be understood that part of the components or steps may not be included or additional components or steps may further be included.

Mobile terminals described herein may include cellular phones, smart phones, laptop computers, digital broadcasting terminals, personal digital assistants (PDAs), portable multimedia players (PMPs), navigators, slate PCs, tablet PCs, ultrabooks, wearable devices (for example, smart watches, smart glasses, head mounted displays (HMDs)), and the like.

However, it may be easily understood by those skilled in the art that the configuration according to the exemplary embodiments of this specification can also be applied to stationary terminals such as digital TV, desktop computers, digital signages, and the like, excluding a case of being applicable only to the mobile terminals.

Figure 1B:
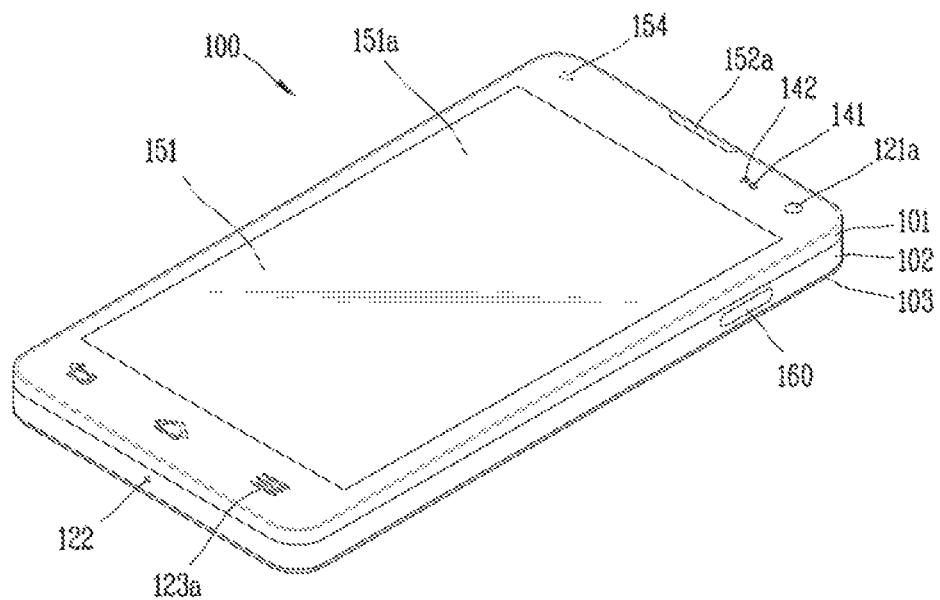
FIGS. 1B and 1C are conceptual views illustrating an example in which a mobile terminal associated with the present disclosure is seen from different directions.
Figure 1C:
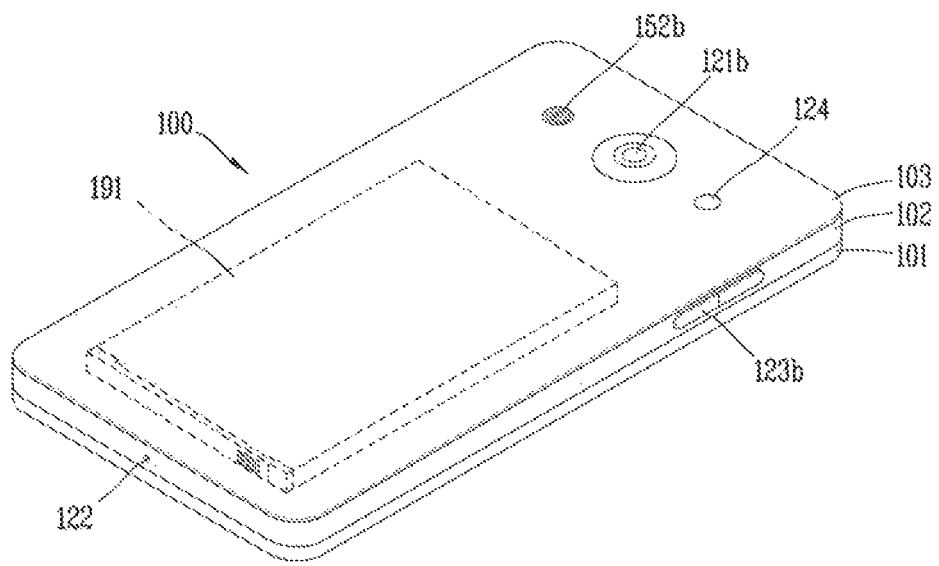

Referring to FIGS. 1A through 1C, FIG. 1A is a block diagram for explaining a mobile terminal associated with the present disclosure, and FIGS. 1B and 1C are conceptual views illustrating an example in which the mobile terminal associated with the present disclosure is seen from different directions.

The mobile terminal 100 may include components, such as a wireless communication unit 110, an input unit 120, a sensing unit 140, an output unit 150, an interface unit 160, a memory 170, a controller 180, a power supply unit 190 and the like. It is understood that implementing all of the illustrated components is not a requirement, and that greater or fewer components may alternatively be implemented. Referring now to FIG. 1A, the mobile terminal 100 is shown having wireless communication unit 110 configured with several commonly implemented components.

In more detail, the wireless communication unit 110 of those components may typically include one or more modules which permit wireless communications between the mobile terminal 100 and a wireless communication system, between the mobile terminal 100 and another mobile terminal 100, or between the mobile terminal 100 and an external server. In addition, the wireless communication unit 110 may include one or more modules for connecting the mobile terminal 100 to one or more networks.

The wireless communication unit 110 may include at least one of a broadcast receiving module 111, a mobile communication module 112, a wireless Internet module 113, a short-range communication module 114, a location information module 115 and the like.

The input unit 120 may include a camera 121 for inputting an image signal, a microphone 122 or an audio input module for inputting an audio signal, or a user input unit 123 (for example, a touch key, a push key (or a mechanical key), etc.) for allowing a user to input information. Audio data or image data collected by the input unit 120 may be analyzed and processed by a user's control command.

The sensing unit 140 may include at least one sensor which senses at least one of internal information of the mobile terminal, a surrounding environment of the mobile terminal and user information. For example, the sensing unit 140 may include a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, refer to the camera 121), a microphone 122, a battery gage, an environment sensor (for example, a barometer, a hygrometer, a thermometer, a radiation detection sensor, a thermal sensor, a gas sensor, etc.), and a chemical sensor (for example, an electronic nose, a health care sensor, a biometric sensor, etc.). The mobile terminal 100 may be configured to utilize information obtained from sensing unit 140, and in particular, information obtained from one or more sensors of the sensing unit 140, and combinations thereof.

The output unit 150 may be configured to output an audio signal, a video signal or a tactile signal. The output unit 150 may include a display unit 151, an audio output module 152, a haptic module 153, an optical output unit 154 and the like. The display unit 151 may have an inter-layered structure or an integrated structure with a touch sensor in order to facilitate a touch screen. The touch screen may provide an output interface between the mobile terminal 100 and a user, as well as functioning as the user input unit 123 which provides an input interface between the mobile terminal 100 and the user.

The interface unit 160 serves as an interface with various types of external devices that can be coupled to the mobile terminal 100. The interface unit 160, for example, may include wired or wireless headset ports, external power supply ports, wired or wireless data ports, memory card ports, ports for connecting a device having an identification module, audio input/output (I/O) ports, video I/O ports, earphone ports, or the like. The mobile terminal 100 may execute an appropriate control associated with a connected external device, in response to the external device being connected to the interface unit 160.

In addition, the memory 170 stores data that support various functions of the mobile terminal 100. The memory 170 is typically implemented to store data to support various functions or features of the mobile terminal 100. For instance, the memory 170 may be configured to store application programs executed in the mobile terminal 100, data or instructions for operations of the mobile terminal 100, and the like. At least some of those application programs may be downloaded from an external server via wireless communication. Some others of those application programs may be installed within the mobile terminal 100 at the time of being shipped for basic functions of the mobile terminal 100 (for example, receiving a call, placing a call, receiving a message, sending a message, etc.). On the other hand, the application programs may be stored in the memory 170, installed in the mobile terminal 100, and executed by the controller 180 to perform an operation (or a function) of the mobile terminal 100.

The controller 180 may typically control an overall operation of the mobile terminal 100 in addition to the operations associated with the application programs. The controller 180 may provide or process information or functions appropriate for a user in a manner of processing signals, data, information and the like, which are input or output by the aforementioned components, or activating the application programs stored in the memory 170.

Furthermore, the controller 180 may control at least part of the components illustrated in FIG. 1A, in order to drive the application programs stored in the memory 170. In addition, the controller 180 may drive the application programs by combining at least two of the components included in the mobile terminal 100 for operation.

The power supply unit 190 may receive external power or internal power and supply appropriate power required for operating respective elements and components included in the mobile terminal 100 under the control of the controller 180. The power supply unit 190 may include a battery, and the battery may be an embedded battery or a replaceable battery.

At least part of those elements and components may be combined to implement operation and control of the mobile terminal or a control method of the mobile terminal according to various exemplary embodiments described herein. Furthermore, the operation and control or the control method of the mobile terminal may be implemented in the mobile terminal in such a manner of activating at least one application program stored in the memory 170.

Hereinafter, each aforementioned component will be described in more detail with reference to FIG. 1A, prior to explaining various exemplary embodiments implemented by the mobile terminal 100 having the configuration.

First, the wireless communication unit 110 will be described. The broadcast receiving module 111 of the wireless communication unit 110 may receive a broadcast signal and/or broadcast associated information from an external broadcast managing entity via a broadcast channel. The broadcast channel may include a satellite channel and/or a terrestrial channel. At least two broadcast receiving modules 111 may be provided in the portable electronic device 100 to simultaneously receive at least two broadcast channels or switch the broadcast channels.

The mobile communication module 112 may transmit/receive wireless signals to/from at least one of network entities, for example, a base station, an external terminal, a server, and the like, on a mobile communication network, which is constructed according to technical standards or transmission methods for mobile communications (for example, Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), etc.)

The wireless signals may include audio call signal, video (telephony) call signal, or various formats of data according to transmission/reception of text/multimedia messages.

The wireless Internet module 113 refers to a module for supporting wireless Internet access, and may be built-in or externally installed on the mobile terminal 100. The wireless Internet module 113 may transmit and/or receive wireless signals via communication networks according to wireless Internet technologies.

Examples of such wireless Internet access may include Wireless LAN (WLAN), Wireless-Fidelity (Wi-Fi), Wireless Fidelity Direct (Wi-Fi Direct), Digital Living Network Alliance (DLNA), Wireless Broadband (WiBro), World Interoperability for Microwave Access (WiMAX), High Speed Downlink Packet Access (HSDPA), High Speed Uplink Packet Access (HSUPA), LTE (Long Term Evolution), LTE-A (Long Term Evolution-Advanced), and the like. The wireless Internet module 113 may transmit/receive data according to at least one wireless Internet technology within a range including even Internet technologies which are not aforementioned.

From the perspective that the wireless Internet accesses according to Wibro, HSDPA, GSM, CDMA, WCDMA, LTE, LTE-A and the like are executed via a mobile communication network, the wireless Internet module 113 which performs the wireless Internet access via the mobile communication network may be understood as a type of the mobile communication module 112.

The short-range communication module 114 denotes a module for short-range communications. Suitable technologies for implementing the short-range communications may include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, and the like. The short-range communication module 114 may support wireless communications between the mobile terminal 100 and a wireless communication system, between the mobile terminal 100 and another mobile terminal 100, or between the mobile terminal and a network where another mobile terminal 100 (or an external server) is located, via wireless personal area networks. The short-range communication module 114 denotes a module for short-range communications.

Here, the another mobile terminal 100 may be a wearable device, for example, a smart watch, smart glasses or a head mounted display (HMD), which is able to exchange data with the mobile terminal 100 (or to link data with the mobile terminal 100). The short-range communication module 114 may sense (recognize) a wearable device, which is able to communicate with the mobile terminal), near the mobile terminal 100. In addition, when the sensed wearable device is a device which is authenticated to communicate with the mobile terminal 100 according to the present disclosure, the controller 180 may transmit at least part of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position of the mobile terminal. As an example, the location information module 115 includes a Global Position System (GPS) module, a WiFi module, or both. For example, when the mobile terminal uses the GPS module, a position of the mobile terminal may be acquired using a signal sent from a GPS satellite. As another example, when the mobile terminal uses the Wi-Fi module, a position of the mobile terminal may be acquired based on information associated with a wireless access point (AP) which transmits or receives a wireless signal to or from the Wi-Fi module. According to the need, the location information module 115 may perform any function of the other modules of the wireless communication unit 110 to obtain data on the location of the mobile terminal. As a module used to acquire the location (or current location) of the mobile terminal, the location information module 115 may not be necessarily limited to a module for directly calculating or acquiring the location of the mobile terminal.

Next, the input unit 120 may be configured to provide an audio or video signal (or information) input to the mobile terminal or information input by a user to the mobile terminal. For the input of the audio information, the mobile terminal 100 may include one or a plurality of cameras 121. The camera 121 processes a image frame, such as still picture or video, acquired by an image sensor in a video phone call or image capturing mode. The processed image frames may be displayed on the display unit 151. On the other hand, the plurality of cameras 121 disposed in the mobile terminal 100 may be arranged in a matrix configuration. By use of the cameras 121 having the matrix configuration, a plurality of image information having various angles or focal points may be input into the mobile terminal 100. As another example, the cameras 121 may be located in a stereoscopic arrangement to acquire left and right images for implementing a stereoscopic image.

The microphone 122 may process an external audio signal into electric audio data. The processed audio data may be utilized in various manners according to a function being executed in the mobile terminal 100 (or an application program being executed). On the other hand, the microphone 122 may include assorted noise removing algorithms to remove noise generated in the course of receiving the external audio signal.

The user input unit 123 may receive information input by a user. When information is input through the user input unit 123, the controller 180 may control an operation of the mobile terminal 100 to correspond to the input information. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

On the other hand, the sensing unit 140 may sense at least one of internal information of the mobile terminal, surrounding environment information of the mobile terminal and user information, and generate a sensing signal corresponding to it. The controller 180 may control an operation of the mobile terminal 100 or execute data processing, a function or an operation associated with an application program installed in the mobile terminal based on the sensing signal. Hereinafter, description will be given in more detail of representative sensors of various sensors which may be included in the sensing unit 140.

First, a proximity sensor 141 refers to a sensor to sense presence or absence of an object approaching to a surface to be sensed, or an object disposed near a surface to be sensed, by using an electromagnetic field or infrared rays without a mechanical contact. The proximity sensor 141 may be arranged at an inner region of the mobile terminal covered by the touch screen, or near the touch screen.

The proximity sensor 141 may include an optical transmission type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and so on. When the touch screen is implemented as a capacitance type, the proximity sensor 141 may sense proximity of a pointer to the touch screen by changes of an electromagnetic field, which is responsive to an approach of an object with conductivity. In this case, the touch screen (touch sensor) may also be categorized as a proximity sensor.

On the other hand, for the sake of brief explanation, a behavior in which the pointer is positioned to be proximate onto the touch screen without contact will be referred to as "proximity touch," whereas a behavior in which the pointer substantially comes into contact with the touch screen will be referred to as "contact touch." For the position corresponding to the proximity touch of the pointer on the touch screen, such position will correspond to a position where the pointer faces perpendicular to the touch screen upon the proximity touch of the pointer. The proximity sensor 141 may sense proximity touch, and proximity touch patterns (e.g., distance, direction, speed, time, position, moving state, etc.). On the other hand, the controller 180 may process data (or information) corresponding to the proximity touches and the proximity touch patterns sensed by the proximity sensor 141, and output visual information corresponding to the process data on the touch screen. In addition, the controller 180 may control the mobile terminal 100 to execute different operations or process different data (or information) according to whether a touch with respect to the same point on the touch screen is either a proximity touch or a contact touch.

A touch sensor can sense a touch applied to the touch screen, such as display unit 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151 or a capacitance occurring from a specific part of the display unit 151, into electric input signals. Also, the touch sensor may be configured to sense not only a touched position and a touched area, but also touch pressure. Here, the touch object body may be a finger, a touch pen or stylus pen, a pointer, or the like as an object through which a touch is applied to the touch sensor.

As described above, when a touch input is sensed by a touch sensor, corresponding signals may be transmitted to a touch controller. The touch controller may process the received signals, and then transmit corresponding data to the controller 180. Accordingly, the controller 180 may sense which region of the display unit 151 has been touched. Here, the touch controller may be a component separate from the controller 180 or the controller 180 itself.

On the other hand, the controller 180 may execute a different control or the same control according to a type of an object which touches the touch screen (or a touch key provided in addition to the touch screen). Whether to execute the different control or the same control according to the object which gives a touch input may be decided based on a current operating state of the mobile terminal 100 or a currently executed application program.

Meanwhile, the touch sensor and the proximity sensor may be executed individually or in combination, to sense various types of touches, such as a short (or tap) touch, a long touch, a multi-touch, a drag touch, a flick touch, a pinch-in touch, a pinch-out touch, a swype touch, a hovering touch, and the like.

An ultrasonic sensor may be configured to recognize position information relating to a sensing object by using ultrasonic waves. On the other hands, the controller 180 may calculate a position of a wave generation source based on information sensed by an illumination sensor and a plurality of ultrasonic sensors. Since light is much faster than ultrasonic waves, a time for which the light reaches the optical sensor may be much shorter than a time for which the ultrasonic wave reaches the ultrasonic sensor. The position of the wave generation source may be calculated using the fact. In more detail, the position of the wave generation source may be calculated by using a time difference from the time that the ultrasonic wave reaches based on the light as a reference signal.

The camera 121 constructing the input unit 120 may be a type of camera sensor. The camera sensor may include at least one of a photo sensor (or image sensor) and a laser sensor.

Implementing the camera 121 with a laser sensor may allow detection of a touch of a physical object with respect to a 3D stereoscopic image. The photo sensor may be laminated on the display device. The photo sensor may be configured to scan a movement of the sensing object in proximity to the touch screen. In more detail, the photo sensor may include photo diodes and transistors (TRs) at rows and columns to scan content placed on the photo sensor by using an electrical signal which changes according to the quantity of applied light. Namely, the photo sensor may calculate the coordinates of the sensing object according to variation of light to thus obtain position information of the sensing object.

The display unit 151 may display (output) information processed in the mobile terminal 100. For example, the display unit 151 may display execution screen information of an application program driven in the mobile terminal 100 or user interface (UI) and graphic user interface (GUI) information in response to the execution screen information.

Furthermore, the display unit 151 may also be implemented as a stereoscopic display unit for displaying stereoscopic images.

The stereoscopic display unit may employ a stereoscopic display scheme such as stereoscopic scheme (a glass scheme), an auto-stereoscopic scheme (glassless scheme), a projection scheme (holographic scheme), or the like.

The audio output module 152 is generally configured to output audio data. Such audio data may be obtained from any of a number of different sources, such that the audio data may be received from the wireless communication unit 110 or may have been stored in the memory 170. Also, the audio output module 152 may also provide audible output signals associated with a particular function (e.g., a call signal reception sound, a message reception sound, etc.) carried out by the mobile terminal 100. The audio output module 152 may include a receiver, a speaker, a buzzer or the like.

A haptic module 153 may generate various tactile effects the that user may feel. A typical example of the tactile effect generated by the haptic module 153 may be vibration. Strength, pattern and the like of the vibration generated by the haptic module 153 may be controllable by a user selection or setting of the controller. For example, the haptic module 153 may output different vibrations in a combining manner or a sequential manner.

Besides vibration, the haptic module 153 may generate various other tactile effects, including an effect by stimulation such as a pin arrangement vertically moving with respect to a contact skin, a spray force or suction force of air through a jet orifice or a suction opening, a touch on the skin, a contact of an electrode, electrostatic force, etc., an effect by reproducing the sense of cold and warmth using an element that can absorb or generate heat, and the like.

The haptic module 153 may be configured to transmit tactile effects through a user's direct contact, or a user's muscular sense using a finger or a hand. Two or more haptic modules 153 may be provided according to the particular configuration of the mobile terminal 100.

An optical output module 154 may output a signal for indicating an event generation using light of a light source. Examples of events generated in the mobile terminal 100 may include a message reception, a call signal reception, a missed call, an alarm, a schedule notice, an email reception, an information reception through an application, and the like.

A signal output by the optical output module 154 may be implemented in such a manner that the mobile terminal emits monochromatic light or light with a plurality of colors. The signal output may be terminated as the mobile terminal senses that a user has checked the generated event, for example.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identification device") may take the form of a smart card. Accordingly, the identifying device may be connected with the electronic device 100 via the interface unit 160.

Furthermore, when the mobile terminal 100 is connected with an external cradle, the interface unit 160 may serve as a passage to allow power from the cradle to be supplied to the mobile terminal 100 therethrough or may serve as a passage to allow various command signals input by the user from the cradle to be transferred to the mobile terminal therethrough. Such various command signals or power inputted from the cradle may operate as signals for recognizing that the mobile terminal 100 has accurately been mounted to the cradle.

The memory 170 can store programs to support operations of the controller 180 and store input/output data (for example, phonebook, messages, still images, videos, etc.). The memory 170 may store data associated with various patterns of vibrations and audio which are output in response to touch inputs on the touch screen.

The memory 170 may include at least one type of storage medium including a Flash memory, a hard disk, a multimedia card micro type, a card-type memory (e.g., SD or DX memory, etc.), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, and an optical disk. Also, the mobile terminal 100 may be operated in relation to a web storage device that performs the storage function of the memory 170 over the Internet.

As aforementioned, the controller 180 may typically control the general operations of the mobile terminal 100. For example, the controller 180 may set or release a locked state for restricting a user from inputting a control command with respect to applications when a state of the mobile terminal meets a preset condition.

Furthermore, the controller 180 may also perform controlling and processing associated with voice calls, data communications, video calls, and the like, or perform pattern recognition processing to recognize a handwriting input or a picture drawing input performed on the touch screen as characters or images, respectively. In addition, the controller 180 may control one or combination of those components in order to implement various exemplary embodiment disclosed herein on the mobile terminal 100.

The power supply unit 190 may receive external power or internal power and supply appropriate power required for operating respective elements and components included in the electronic device 100 under the control of the controller 180. The power supply unit 190 may include a battery, which is typically rechargeable or be detachably coupled to the terminal body for charging.

Furthermore, the power supply unit 190 may include a connection port. The connection port may be configured as one example of the interface unit 160 to which an external (re)charger for supplying power to recharge the battery is electrically connected.

As another example, the power supply unit 190 may be configured to recharge the battery in a wireless manner without use of the connection port. Here, the power supply unit 190 may receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable or its similar medium using, for example, software, hardware, or any combination thereof.

Referring to FIGS. 1B and 1C, the mobile terminal 100 disclosed herein may be provided with a bar-type terminal body. However, the present disclosure may not be necessarily limited to this, and may be also applicable to various structures such as a watch type, a clip type, a glasses type, a folder type in which two or more bodies are coupled to each other in a relatively movable manner, a slide type, a swing type, a swivel type, and the like. The description in association with a specific type of mobile terminal or on a specific type of mobile terminal will be also typically applied to another type of mobile terminal.

Here, the terminal body may be understood as a conception which indicates the mobile terminal 100 as at least one assembly.

The mobile terminal 100 may include a case (for example, a frame, a housing, a cover, etc.) constituting the appearance thereof. In this embodiment, the case may be divided into a front case 101 and a rear case 102. Various electronic components may be incorporated into a space formed between the front case 101 and the rear case 102. At least one middle case may be additionally disposed between the front case 101 and the rear case 102.

A display unit 151 may be disposed on a front surface of the terminal body to output information. As illustrated, a window 151a of the display unit 151 may be mounted to the front case 101 so as to form the front surface of the terminal body together with the front case 101.

In some cases, electronic components may also be mounted to the rear case 102. Examples of those electronic components mounted to the rear case 102 may include a detachable battery, an identification module, a memory card and the like. Here, a rear cover 103 for covering the electronic components mounted may be detachably coupled to the rear case 102. Therefore, when the rear cover 103 is detached from the rear case 102, the electronic components mounted to the rear case 102 may be externally exposed.

As illustrated, when the rear cover 103 is coupled to the rear case 102, a side surface of the rear case 102 may be partially exposed. In some cases, upon the coupling, the rear case 102 may also be completely shielded by the rear cover 103. On the other hand, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

Unlike the example which the plurality of cases form an inner space for accommodating such various components, the mobile terminal 100 may be configured such that one case forms the inner space. In this example, a mobile terminal 100 having a uni-body formed in such a manner that synthetic resin or metal extends from a side surface to a rear surface may also be implemented.

On the other hand, the mobile terminal 100 may include a waterproofing unit (not shown) for preventing an introduction of water into the terminal body. For example, the waterproof portion may include a waterproof member provided between the window 151a and the front case 101, between the front case 101 and the rear case 102, or between the rear case 102 and the back cover 103, to hermetically seal an inner space when those cases are coupled to each other.

The mobile terminal 100 may include a display unit 151, first and second audio output modules 152a and 152b, a proximity sensor 141, an illumination sensor 152, an optical output module 154, first and second cameras 121a and 121b, first and second manipulation units 123a and 123b, a microphone 122, an interface unit 160 and the like.

Hereinafter, description will be given of an exemplary mobile terminal 100 that the display unit 151, the first audio output module 152a, the proximity sensor 141, the illumination sensor 142, the optical output module 154, the first camera 121a and the first manipulation unit 123a are disposed on the front surface of the terminal body, the second manipulation unit 123b, the microphone 122 and the interface unit 160 are disposed on a side surface of the terminal body, and the second audio output module 152b and the second camera 121b are disposed on a rear surface of the terminal body, with reference to FIGS. 1B and 1C.

However, the foregoing configuration may not be necessarily limited to the arrangement. The foregoing configuration may be excluded, substituted or disposed on another surface if necessary. For example, the first manipulation unit 123a may not be disposed on the front surface of the terminal body, and the second audio output module 152b may be disposed on the side surface other than the rear surface of the terminal body.

The display unit 151 may display (output) information processed in the mobile terminal 100. For example, the display unit 151 may display execution screen information of an application program driven in the mobile terminal 100 or user interface (UI) and graphic user interface (GUI) information in response to the execution screen information.

The display unit 151 may include at least one of a liquid crystal display (LCD), a thin film transistor-liquid crystal display (TFT-LCD), an organic light emitting diode (OLED), a flexible display, a 3-dimensional (3D) display, and an e-ink display.

The display unit 151 may be implemented in two or more in number according to a configured aspect of the mobile terminal 100. For instance, a plurality of the display units 151 may be arranged on one surface to be spaced apart from or integrated with each other, or may be arranged on different surfaces.

The display unit 151 may include a touch sensor which senses a touch onto the display unit so as to receive a control command in a touching manner. When a touch is input to the display unit 151, the touch sensor may be configured to sense this touch and the controller 180 may generate a control command corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

As described above, the display unit 151 may form a touch screen together with the touch sensor. Here, the touch screen may serve as the user input unit 123 (see FIG. 1A). Therefore, the touch screen may replace at least some of the functions of the first manipulation unit 123a.

The first audio output module 152a may be implemented in the form of a receiver for transferring voice sounds to the user's ear or a loud speaker for outputting various alarm sounds or multimedia reproduction sounds.

The window 151a of the display unit 151 may include a sound hole for emitting sounds generated from the first audio output module 152a. Here, the present disclosure may not be limited to this. It may also be configured such that the sounds are released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the mobile terminal 100.

The optical output module 154 may output light for indicating an event generation. Examples of the event generated in the electronic device 100 may include a message reception, a call signal reception, a missed call, an alarm, a schedule notice, an email reception, information reception through an application, and the like. When a user's event check is sensed, the controller 180 may control the optical output unit 154 to end the output of light.

The first camera 121a may process video frames such as still or moving images acquired by the image sensor in a video call mode or a capture mode. The processed video frames may be displayed on the display unit 151 or stored in the memory 170.

The first and second manipulation units 123a and 123b are examples of the user input unit 123, which may be manipulated by a user to input a command for controlling the operation of the mobile terminal 100. The first and second manipulation units 123a and 123b may employ any method if it is a tactile manner allowing the user to perform manipulation with a tactile feeling such as touch, push, scroll or the like. In addition, the first and second manipulation units 123a and 123b may also employ a method of allowing the user to perform manipulation without a tactile feeling through a proximity touch, a hovering touch, or the like.

The drawings are illustrated on the basis that the first manipulation unit 123a is a touch key, but the present disclosure may not be necessarily limited to this. For example, the first manipulation unit 123a may be configured with a mechanical key, or a combination of a touch key and a push key.

The content received by the first and second manipulation units 123a and 123b may be set in various ways. For example, the first manipulation unit 123a may be used by the user to input a command such as menu, home key, cancel, search, or the like, and the second manipulation unit 123b may be used by the user to input a command, such as controlling a volume level being output from the first or second audio output module 152a or 152b, switching into a touch recognition mode of the display unit 151, or the like.

On the other hand, as another example of the user input unit 123, a rear input unit (not shown) may be disposed on the rear surface of the terminal body. The rear input unit may be manipulated by a user to input a command for controlling an operation of the mobile terminal 100. The content input may be set in various ways. For example, the rear input unit may be used by the user to input a command, such as power on/off, start, end, scroll or the like, controlling a volume level being output from the first or second audio output module 152a or 152b, switching into a touch recognition mode of the display unit 151, or the like. The rear input unit may be implemented into a form allowing a touch input, a push input or a combination thereof.

The rear input unit may be disposed to overlap with the display unit 151 of the front surface in a thickness direction of the terminal body. As one example, the rear input unit may be disposed on an upper end portion of the rear surface of the terminal body such that a user can easily manipulate it using a forefinger when the user grabs the terminal body with one hand. However, the present disclosure may not be limited to this, and the position of the rear input unit may be changeable.

When the rear input unit is disposed on the rear surface of the terminal body as described above, a new user interface may be implemented using the rear input unit. Also, the aforementioned touch screen or the rear input unit may substitute for at least part of functions of the first manipulation unit 123a located on the front surface of the terminal body. Accordingly, when the first manipulation unit 123a is not disposed on the front surface of the terminal body, the display unit 151 may be implemented to have a larger screen.

On the other hand, the mobile terminal 100 may include a fingerprint recognition sensor for recognizing a user's fingerprint, and the controller 180 may use fingerprint information sensed through the finger recognition sensor as an authentication means. The finger scan sensor may be installed in the display unit 151 or the user input unit 123.

The microphone 122 may be formed to receive the user's voice, other sounds, and the like. The microphone 122 may be provided at a plurality of places, and configured to receive stereo sounds.

The interface unit 160 may serve as a path allowing the mobile terminal 100 to exchange data with external devices. For example, the interface unit 160 may be at least one of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b may be further mounted to the rear surface of the terminal body. The second camera 121b may have an image capturing direction, which is substantially opposite to the direction of the first camera unit 121a.

The second camera 121b may include a plurality of lenses arranged along at least one line. The plurality of lenses may also be arranged in a matrix configuration. The cameras may be referred to as an 'array camera.' When the second camera 121b is implemented as the array camera, images may be captured in various manners using the plurality of lenses and images with better qualities may be obtained.

A flash 124 may be disposed adjacent to the second camera 121b. When an image of a subject is captured with the camera 121b, the flash 124 may illuminate the subject.

The second audio output module 152b may further be disposed on the terminal body. The second audio output module 152b may implement stereophonic sound functions in conjunction with the first audio output module 152a, and may be also used for implementing a speaker phone mode for call communication.

At least one antenna for wireless communication may be disposed on the terminal body. The antenna may be installed in the terminal body or formed on the case. For example, an antenna which configures a part of the broadcast receiving module 111 (see FIG. 1A) may be retractable into the terminal body. Alternatively, an antenna may be formed in a form of film to be attached onto an inner surface of the rear cover 103 or a case including a conductive material may serve as an antenna.

A power supply unit 190 (see FIG. 1A) for supplying power to the mobile terminal 100 may be disposed on the terminal body. The power supply unit 190 may include a batter 191 which is mounted in the terminal body or detachably coupled to an outside of the terminal body.

The battery 191 may receive power via a power source cable connected to the interface unit 160. Also, the battery 191 may be (re)chargeable in a wireless manner using a wireless charger. The wireless charging may be implemented by magnetic induction or electromagnetic resonance.

On the other hand, the drawing illustrates that the rear cover 103 is coupled to the rear case 102 for shielding the battery 191, so as to prevent separation of the battery 191 and protect the battery 191 from an external impact or foreign materials. When the battery 191 is detachable from the terminal body, the rear case 103 may be detachably coupled to the rear case 102.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may link with the display unit 151 to extend the function of the mobile terminal 100. Another example of the accessory may be a touch pen for assisting or extending a touch input onto a touch screen.

Figure 3B:
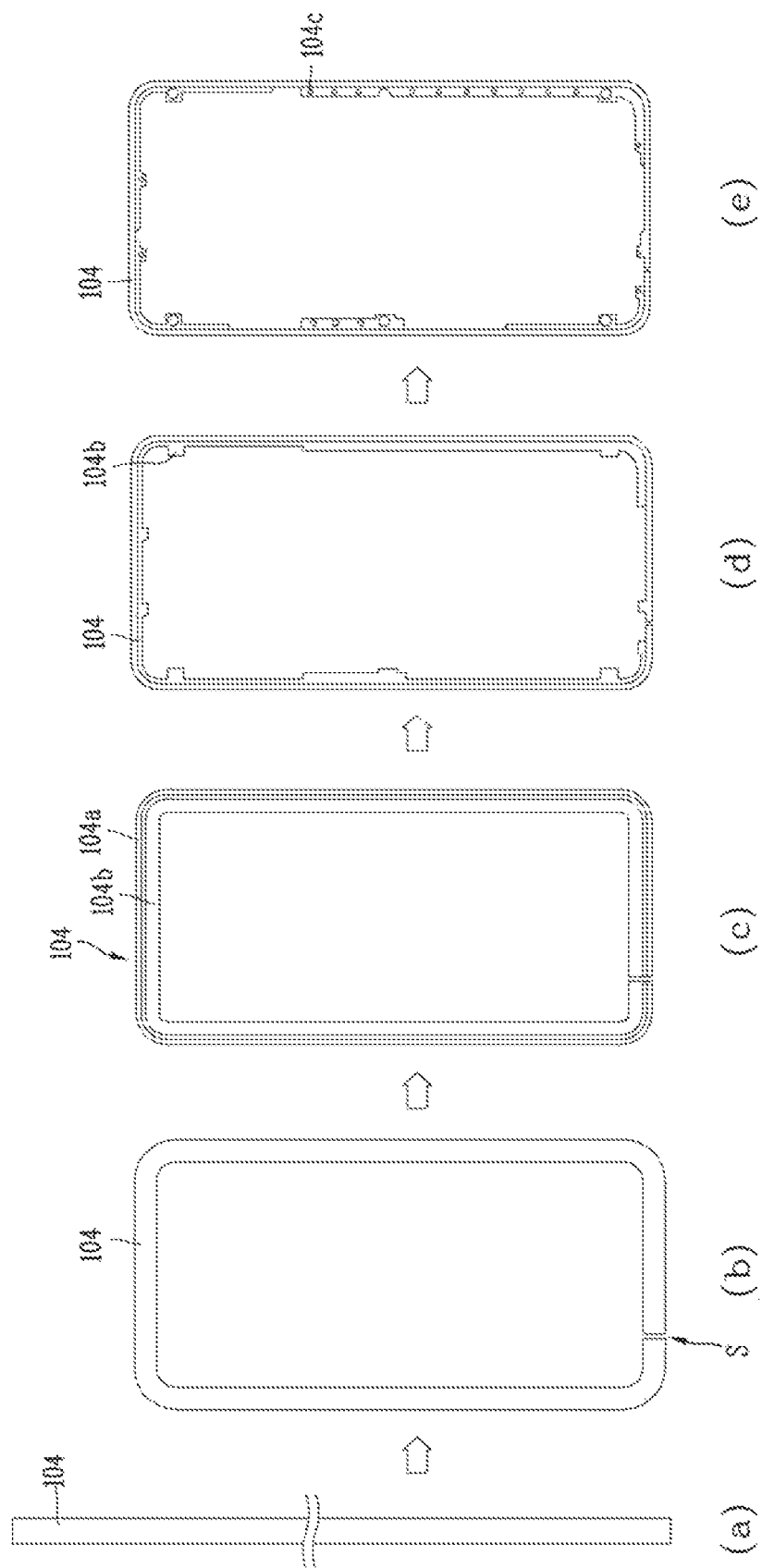
Figure 4:
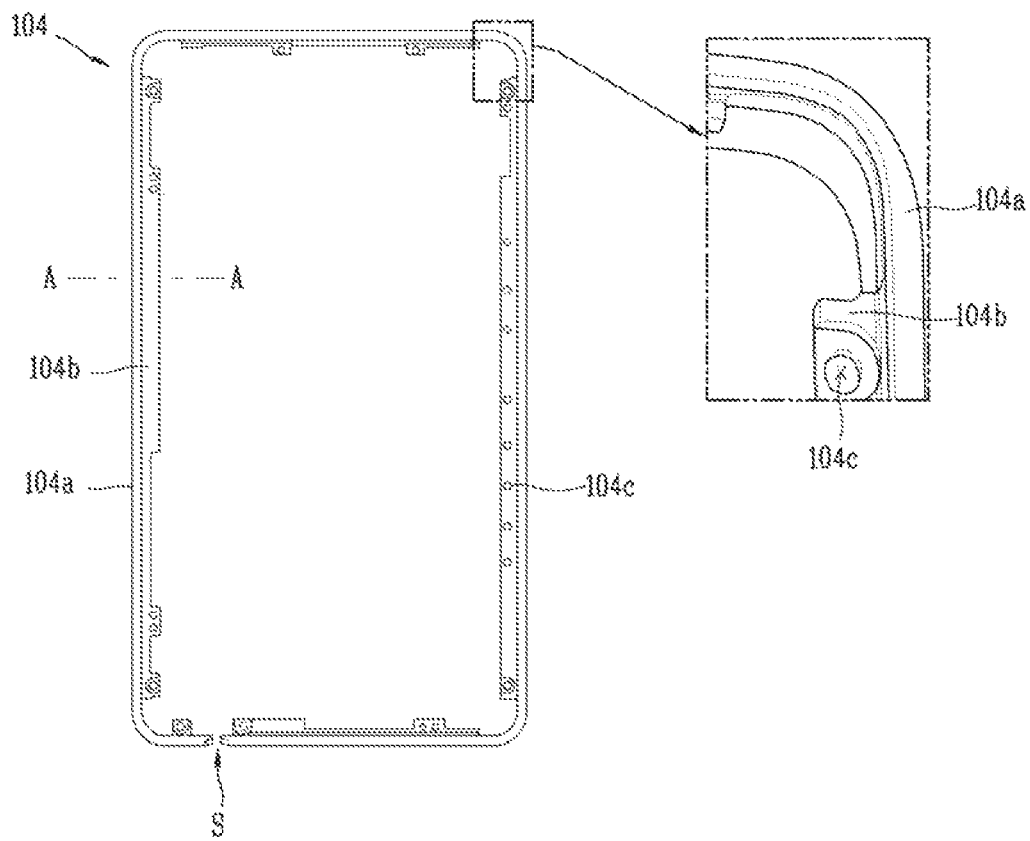
FIG. 4 is a rear view illustrating a side frame according to an embodiment of the present disclosure.
Figure 5:
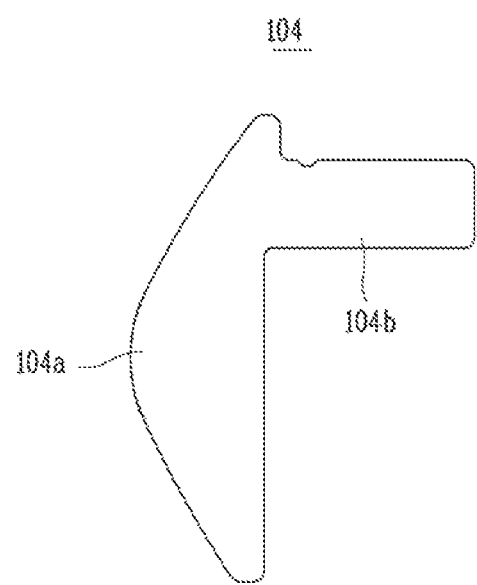
FIG. 5 is a cross-sectional view taken along line A-A in FIG. 4.

FIG. 2 is an exploded view illustrating a mobile terminal according to an embodiment of the present disclosure, and FIGS. 3A and 3B are views illustrating a process of coupling a rear case to a side case according to an embodiment of the present disclosure, and FIG. 4 is a rear view illustrating a side frame according to an embodiment of the present disclosure, and FIG. 5 is a cross-sectional view taken along line A-A in FIG. 4.

The mobile terminal 100 according to an embodiment of the present disclosure includes a front case 101 in which the display unit 151 is accommodated, a rear case 102 provided on a rear surface of the front case 101, and a side case 104 surrounding a side surface of the case 102 to form an outer appearance thereof. The side case 104 is an integrally formed metal member, and both end portions thereof are spaced apart from each other to form a single slit (S) at a lower end portion of the side case 104. At this time, the single slit (S) may be a blocking wall separating the conductive loop of the antenna 130, or may be a route serving as a bridge to connect the conductive loop.

Figure 8:
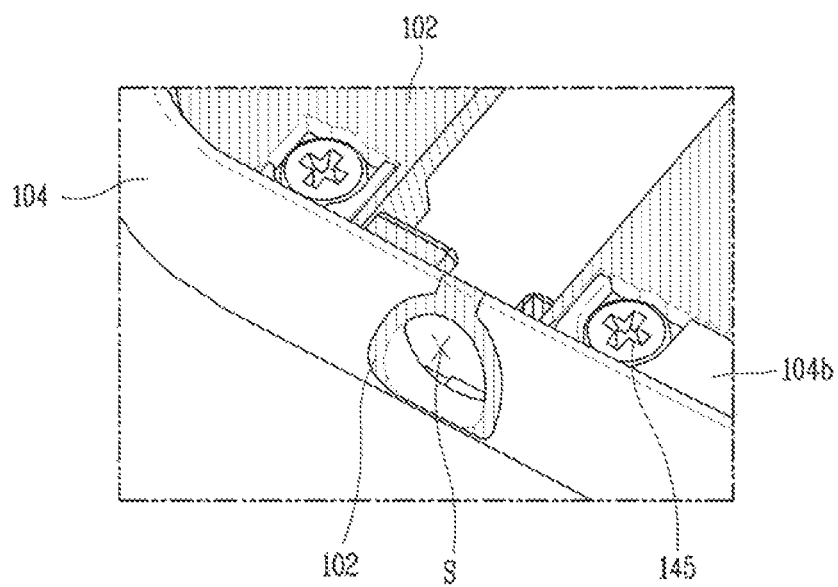
FIG. 8 is an enlarged perspective view of a portion "C" in FIG. 6.

The side surface of the mobile terminal 100 according to an embodiment of the present disclosure refers to a surface connecting the front side and the rear side, and the side case 104 forms a side appearance of the mobile terminal 100. The side case 104 forms the side surface of the mobile terminal 100, but the rear case 102 is exposed to the outside through the slit (S) to form a side appearance thereof as illustrated in FIG. 8 in a region formed with the slit (S). The slit (S) may be an ear jack hole or a USB port, and according to an embodiment of the present disclosure, it is illustrated as an insertion hole in which an ear jack is inserted into the slit (S).

Part of the rear case 102 is extended on an inner side of the single slit (S) to support the inside of the insertion hole by the single slit (S). At this time, the rear case 102 has a plate shape formed to cover a rear surface of the mobile terminal 100, and may be formed with a plurality of ribs or through holes.

The rear case 102 is made of a non-metallic material so as to cut off the flow of current in the side case 104 by the rear case 102 when the current flows through the side case 104. The side case 104 includes an exposed portion 104a exposed to the outside to form an external appearance of the mobile terminal 100 and a support portion 104b extended from the exposed portion 104a and inwardly protruded to be coupled to the rear case 102. A plurality of through holes 104c are formed on the support portion 104b to be coupled to other members such as the front case 101 or the rear case 102.

As illustrated in FIG. 2, a main circuit board 181 and a battery 191 are provided between the rear case 102 and the front case 101. The rear case 102 is formed with a hole 102b through which the battery 191 passes, and a battery accommodation portion 194 is formed in the front case 101. The main circuit board 181 has a substantially E or C shape and is electrically connected to the intermediate frame 185. A rear surface of the rear case 102 is covered by the rear cover 103.

The side case 104 according to an embodiment of the present disclosure is made of a metal material to function as a radiator of the antenna 130, and further includes an intermediate frame 185 made of a metal material provided in the front case 101 for the grounding of the antenna 130. The intermediate frame 185 performs a function of extending the ground (GND) area and a function of a support for supporting the inside of the mobile terminal 100.

Figure 11:
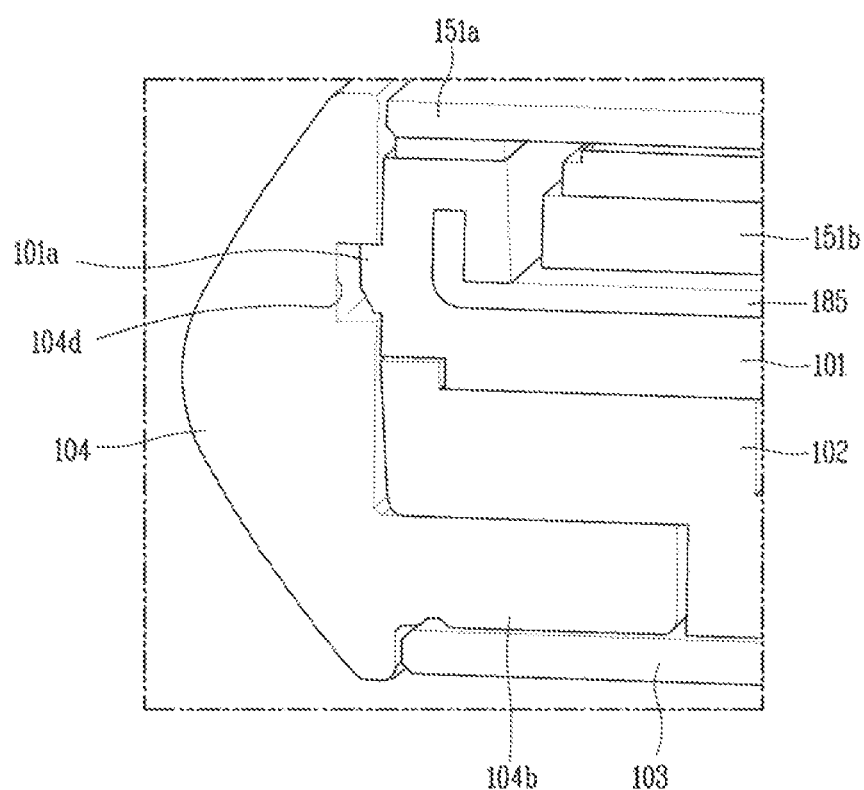
FIG. 11 is a partial cross-sectional view illustrating a mobile terminal according to an embodiment of the present disclosure.

As illustrated in FIG. 11, the intermediate frame 185 may be insert-injected into the front case 101, and one side thereof may be formed in contact with the display 151b.

The intermediate frame 185 may be formed of a metal material to maintain sufficient rigidity even when the intermediate frame 185 is formed to have a small thickness. The intermediate frame 185 may operate as a ground (GND). In other words, the main circuit board 181 or the antenna 130 may be connected and grounded to the intermediate frame 185, and the intermediate frame 185 may operate as a ground (GND) of the main circuit board 181 or the antenna 130. In this case, the intermediate frame 185 may extend the ground (GND) of the mobile terminal 100. Therefore, the ground (GND) in the following description denotes at least one of the intermediate frame 185 and the main circuit board 181.

The main circuit board 181 is electrically connected to the antenna 130 and configured to process wireless signals (or wireless electromagnetic waves) transmitted and received by the antenna 130. A plurality of transceiver circuits may be formed or mounted on the main circuit board 181 for the processing of wireless signals.

The transceiver circuits may be formed to include one or more integrated circuits and associated electrical elements. For an example, the transceiver circuit may include a transmitter integrated circuit, a receiver integrated circuit, a switching circuit, an amplifier, and the like.

The plurality of transceiver circuits simultaneously may feed power to the conductive members 135, which are radiators, to simultaneously operate the plurality of antennas 130. For example, while either one is transmitting, the other one may receive, and both may transmit or receive.

In an embodiment of the present disclosure, the side case 104 performs a function of a radiator.

Figure 14:
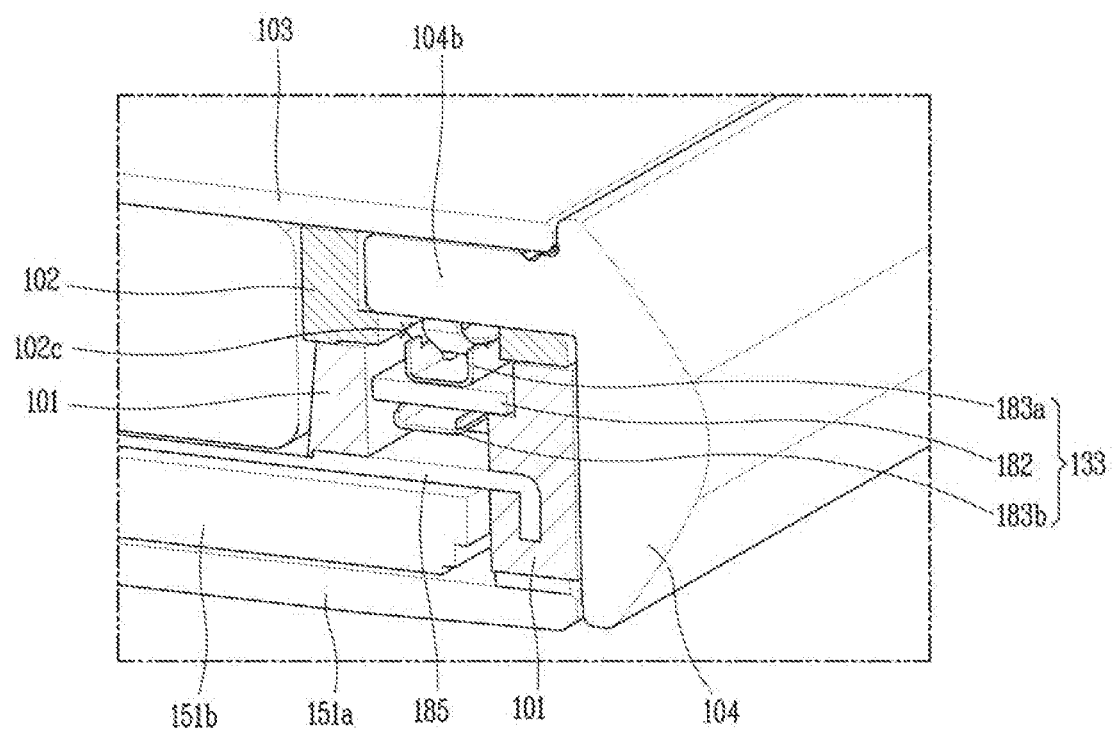
FIG. 14 is a rear perspective view in which part of a mobile terminal according to an embodiment of the present disclosure is cut.

Furthermore, FIG. 14 is a rear perspective view in which part of the mobile terminal 100 according to an embodiment of the present disclosure is cut, and the present disclosure will be described with reference to FIG. 14.

The mobile terminal 100 according to an embodiment of the present disclosure further includes a flexible circuit board 182 provided between the intermediate frame 185 and the rear case 102, and a first ground terminal 183a brought into contact with one surface of the support portion 104b through the through hole 104c formed on part of the rear case 102 is formed on one surface of the flexible circuit board 182, and a second ground terminal 183b brought into contact with the intermediate frame 185 is formed on the other side of the flexible circuit board 182. The first and second ground terminals 183a, 183b constitute one ground portion. Therefore, the first and second ground terminals 183a, 183b may be referred to as a first ground portion 133 or a second ground portion 134. The first and second ground terminals 183a, 183b may be C-clips, for an example.

The side case 104 is grounded to the intermediate frame 185 through the flexible circuit board 182 by the first and second ground terminals 183a, 183b. As described above, a current may flow in the order or reverse order of the support portion 104b, the first ground terminal 183a, the flexible circuit board 182, the second ground terminal 183b, and the intermediate frame 185. To this end, the support portion 104b, the rear case 102, and the front case 101 should be arranged to be partially overlapped with each other. Here, the first and second ground portion 133, 134 include the first and second ground terminals 183a, 183b and the flexible circuit board 182, respectively. In other words, the first ground portion 133 includes the first and second ground terminals 183a, 183b and the flexible circuit board 182, and the second ground portion 134 also includes the first and second ground terminals 183a, 183b and the flexible circuit board 182.

Furthermore, a partial region of the rear case 102 is formed to support the support portion 104b while at the same time the rear case 102 is crossed perpendicular to the partial region, and the rear case 102 has a portion having the same height as that of the base portion 104b in a thickness direction of the support portion 104b to be stably coupled to the side case 104.

Figure 6:
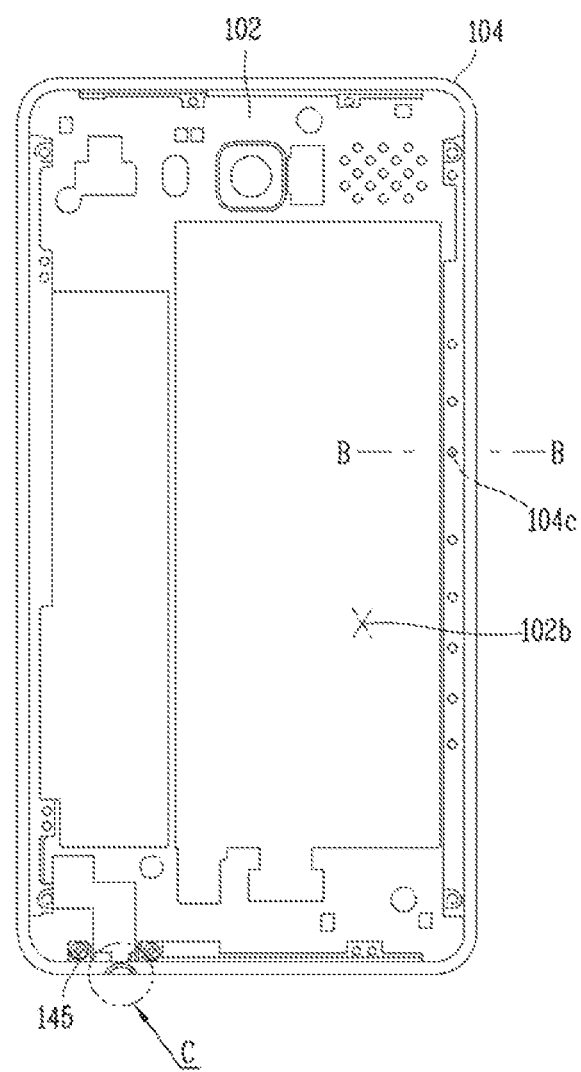
FIG. 6 illustrates a rear case coupled to a side case according to an embodiment of the present disclosure.
Figure 7:
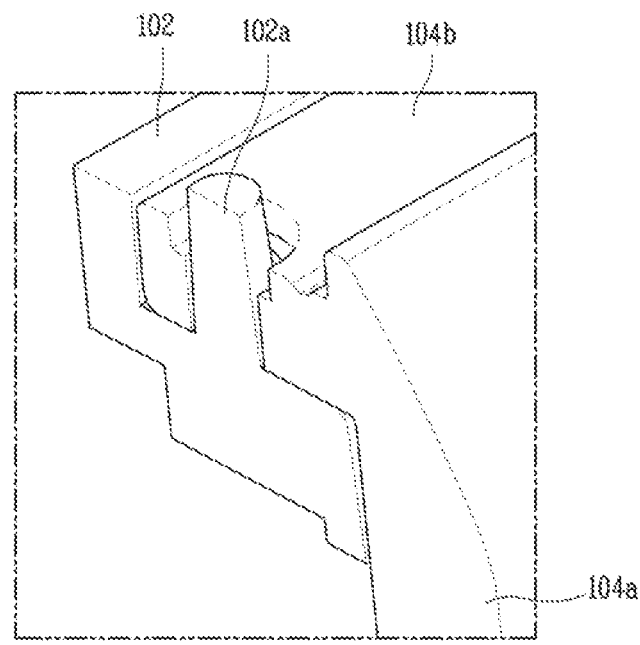
FIG. 7 is a cut perspective view taken along line B-B in FIG. 6.

The support portion 104b is formed on an inner surface of the side case 104 as illustrated in FIGS. 4 and 5, and a protrusion 102a (or boss) is formed on the rear case 102 at a position corresponding to the through hole 104c of the support portion 104b, and the protrusion 102a is passed through the through hole 104c of the support portion 104b and coupled to the support portion 104b by thermal fusion as illustrated in FIGS. 6 and 7. Here, FIG. 6 is a view illustrating the rear case 102 coupled to the side case 104 according to an embodiment of the present disclosure, and FIG. 7 is a cut perspective view taken along line B-B in FIG. 6, illustrating a state prior to the thermal fusion of the protrusion 102a.

As described above, according to an embodiment of the present disclosure, a thermal fusion method may be applied to couple the rear case 102 to the side case 104, and FIG. 8 is an enlarged perspective view of a portion "C" in FIG. 6, wherein the rear case 102 and the side case 104 can be coupled by a fastening member such as a screw 145, as illustrated in FIG. 8.

In this manner, there is a case where the rear case 102 and the support portion 104b are coupled by the screw 145, and in particular, it may be applied to a portion adjacent to the slit (S) to prevent the single slit (S) from being opened. In other words, the rear case 102 and the support portion 104b are coupled with each other by thermal fusion in most of the region, but the screw 145 may be used to more securely fasten a region adjacent to the slit (S) portion. The protrusion 102a, which is a heat fusion boss, is required for the thermal fusion method. A portion extended from the exposed portion 104a of the side case 104 constitutes part of the support portion 104b to fix the screw 145. At this time, a portion adjacent to the through hole 104c is recessed than the other portion to accommodate a portion of the protrusion 102a by thermal fusion. In other words, the protrusion 102a is protruded more outward than the support portion 104b through the through hole 104c in the initial state, but melt by heat to fill a recessed portion around the through hole 104c, thereby coupling the rear case 102 to the side case 104.

The coupling between the side case 104 and the rear case 102 may not be limited to the coupling due to the thermal fusion boss, and the side case 104 and the rear case 102 may also be coupled to each other at a portion adjacent to the single slit (S) portion by thermal fusion, and coupled to each other only by the screw 145 without thermal fusion.

Figure 9:
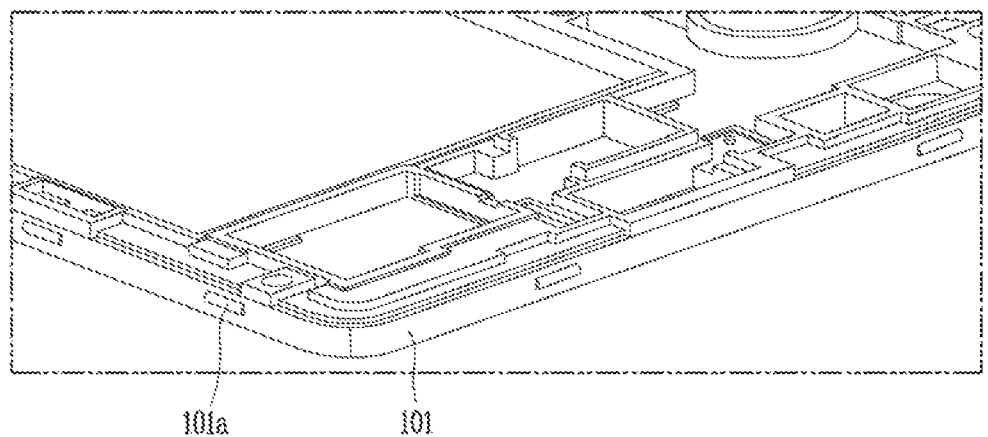
FIG. 9 is a partial perspective view of a front case formed with a hook according to an embodiment of the present disclosure.
Figure 10:
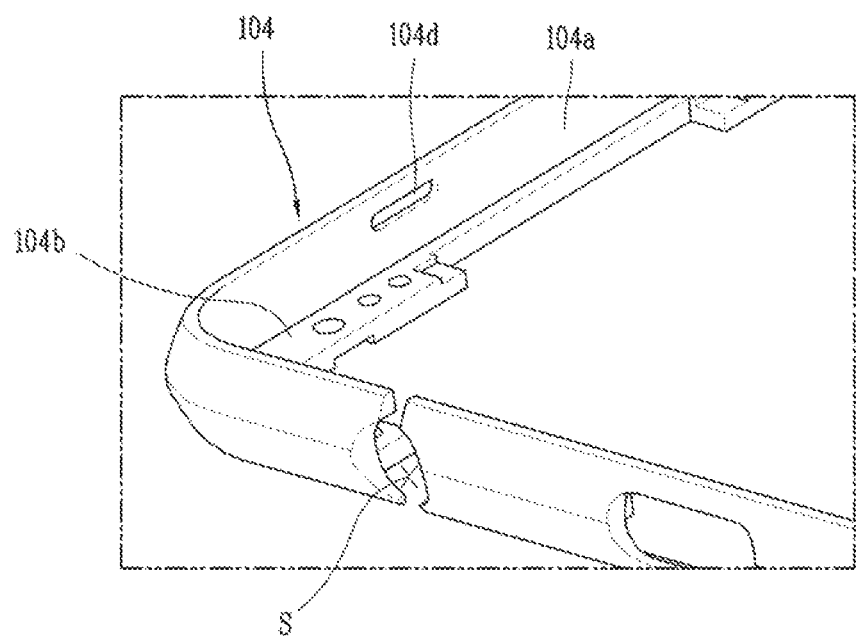
FIG. 10 is a partial perspective view of a side case formed with a groove according to an embodiment of the present disclosure.

On the other hand, FIG. 9 is a partial perspective view of the front case 101 formed with a hook 101a according to an embodiment of the present disclosure, and FIG. 10 is a partial perspective view of the side case 104 formed with a groove 104d according to an embodiment of the present disclosure, and FIG. 11 is a partial cross-sectional view illustrating the mobile terminal 100 according to an embodiment of the present disclosure.

According to an embodiment of the present disclosure, the front case 101 is disposed inside the side case 104, but the front case 101 should securely be fixed to the inside of the side case 104. To this end, a plurality of hooks 101a are protruded on a side surface of the front case 101, and the hooks 101a are inserted into grooves 104d formed on an inner surface of the side case 104 to couple the front case 101 to the side case 104. The hook 101a may be a protruded portion on a side surface of the front case 101, and a plurality of hooks 101a may be spaced apart from each other by a predetermined distance. At this time, the hooks 101a and the grooves 104d may be formed in an elongated manner along one direction to further secure coupling between the front case 101 and the side case 104.

Here, as a cross-sectional view in which a portion formed with the hook 101a and the groove 104d in the mobile terminal 100 according to an embodiment of the present disclosure is cut, FIG. 11 is a view for explaining a state in which the front case 101 and the rear case 102 are arranged on the support portion 104b of the side case 104. As illustrated in FIG. 11, part of the rear case 102 is placed in contact with the support portion 104b, and the front case 101 is provided on one side of the rear case 102. The front case 101 and the side case 104 are fixed in position by the hook 101a.

Figure 12:
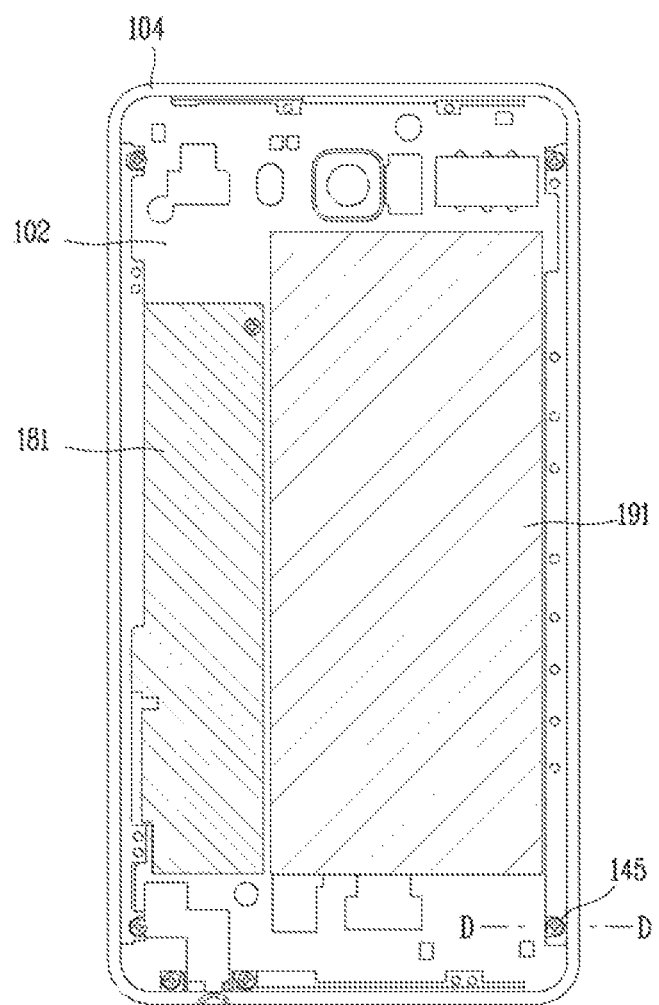
FIG. 12 illustrates a rear view of a mobile terminal in a state in which a rear cover according to an embodiment of the present disclosure is removed.
Figure 13:
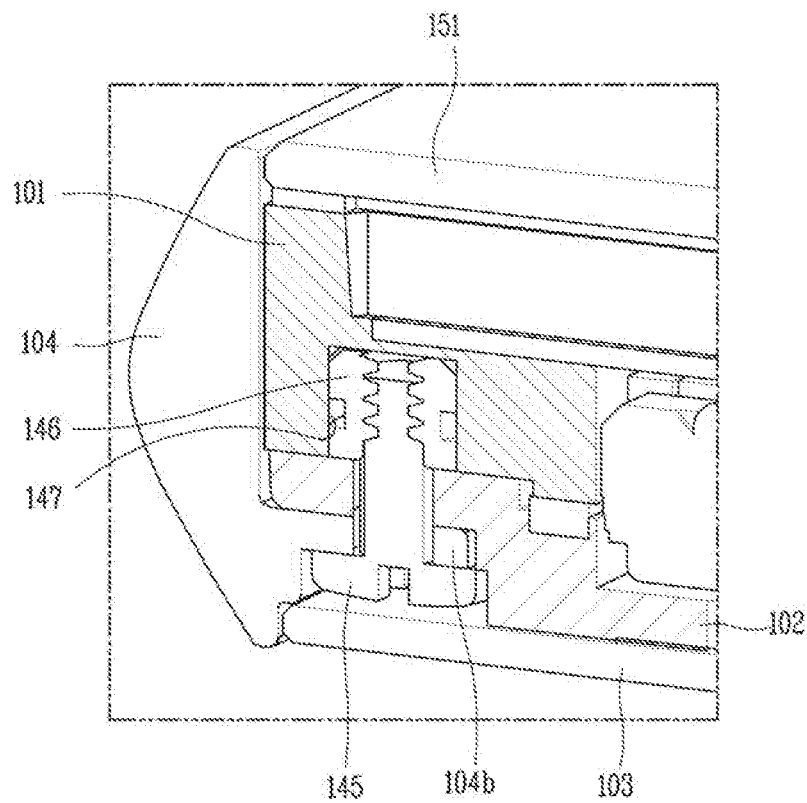
FIG. 13 is a cross-sectional view taken along line D-D in FIG. 12.

FIG. 12 illustrates a rear view of the mobile terminal 100 in a state in which the rear cover 103 according to an embodiment of the present disclosure is removed, and FIG. 13 is a cross-sectional view taken along line D-D in FIG. 12. Referring to FIGS. 12 and 13, the rear case 102 and the front case 101 may be fixed to the side case 104 by the screw 145 passing through the support portion 104b. In other words, as illustrated in FIG. 13, the screw 145 sequentially passes through the support portion 104b, the rear case 102, and the front case 101 to fix the side case 104, the rear case 102, and the front case 101. At this time, a screw groove 147 is formed on a rear surface of the front case 101 and a screw insert 146 is provided in the screw groove 147 to facilitate the engagement of the screw 145. The screw insert 146 is formed with a female screw so as to be screw-coupled to the screw 145.

Meanwhile, in an embodiment of the present disclosure, the side case 104 having a single slit (S) is fabricated by bending a single frame, which will be described with reference to FIGS. 3A and 3B. Furthermore, FIGS. 3A and 3B include a fabrication process of the side case 104 according to an embodiment of the present disclosure, which relates to a fabrication process diagram illustrated in FIGS. 17A and 17B.

Figure 17A:
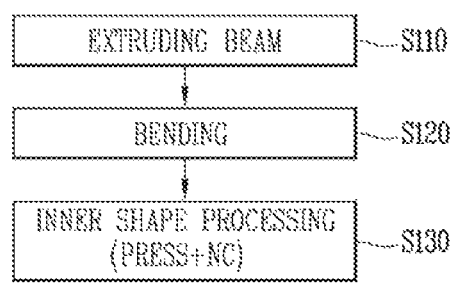
FIGS. 17A and 17B are manufacturing process flow charts of a side case according to an embodiment of the present disclosure.

First, FIG. 3A will be described together with FIG. 17A.

FIG. 3A illustrates a process of fabricating the side case 104 according to an embodiment of the present disclosure, and the side case 104 is initially extruded in an elongated manner along one direction (S110) to form an "L" shaped beam as illustrated in (a) of FIG. 3A. In other words, the exposed portion 104a exposed to the outside and the support portion 104b formed vertically toward an inside of the exposed portion 104a are formed in an elongated manner along one direction.

Then, as shown in (b) of FIG. 3A, bending (S120) is performed so as to bend into the shape of an outer shape of the mobile terminal 100. The side case is bent at four points so as to form substantially a rectangular frame. At this time, both ends of the side case 104 are formed adjacent to each other, but spaced apart from each other by a predetermined distance to form a slit (S). In other words, according to an embodiment of the present disclosure, a single beam may be bent to form the side case 104.

Then, a structure for coupling to the rear case 102 and the front case 101 is formed. For example, as illustrated in (c) of FIG. 3A, part of the support portion 104b is cut or the through hole 104c is formed to process an inner shape of the side case 104 (S130). The groove 104d is formed on an inner surface of the exposed portion 104a. In particular, the support portion 104b is cut at a bent portion of the side case 10, thereby allowing the side case 104 to be smoothly bent. The inner shape processing (S130) includes press and NC (numerical control) processing, and precise numerical control is possible by NC processing.

By the above process, a basic form of the side case 104 is completed, and then, as illustrated in (d) and (e) of FIG. 3A, the rear case 102 is fastened to the support portion 104b. At this time, as described above, the fastening method may be carried out by a thermal fusion method or a fastening member such as the screw 145.

Figure 17B:
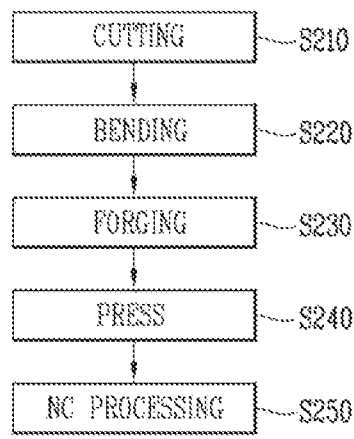

On the other hand, FIB. 3B illustrates a fabrication process of the side case 104 according to another embodiment of the present disclosure, and FIG. 17B is a flowchart of a fabrication process of the side case 104 associated with FIG. 3B. Hereinafter, description will be made with reference to FIG. 3B and FIG. 17B together.

First, as illustrated in (a) of FIG. 3B, a beam having a substantially circular cross section is cut (S210). In other words, it is an "L-"-shaped injection beam in (a) of FIG. 3A, but a circular beam 104 is cut by a length constituting a side surface of the mobile terminal 100 in FIG. 3B. Then, as illustrated in (b) of FIG. 3B, the beam 104 formed in a straight line is bent (S220). The bending process is the same as the bending process illustrated in (b) of FIG. 3A. However, the extruded beam in FIG. 3A is extruded in a state having the exposed portion 104a and the support portion 104b, whereas the beam in FIG. 3B is formed in a state having a substantially circular cross section. Then, a forging process (S230) is carried out in (c) of FIG. 3B. The exposed portion 104a and the support portion 104b are formed by the forging process. When the support portion 104b is formed, a press process (S240) is carried out to remove an unnecessary portion of the support portion 104b as illustrated in (d) of FIG. 3B. The weight of the side case 104 made of a metallic material may be reduced by the press process. The press process is a type of piercing process, and the beam 104 may be heat-treated prior to the press process.

Thereafter, as illustrated in (e) of FIG. 3B, numerical control (NC) processing process (S250) is carried out to form the through hole 104c for coupling with other members. The NC processing process at this time is almost the same as the inner shape processing process (S130) in FIG. 3A.

Figure 16:
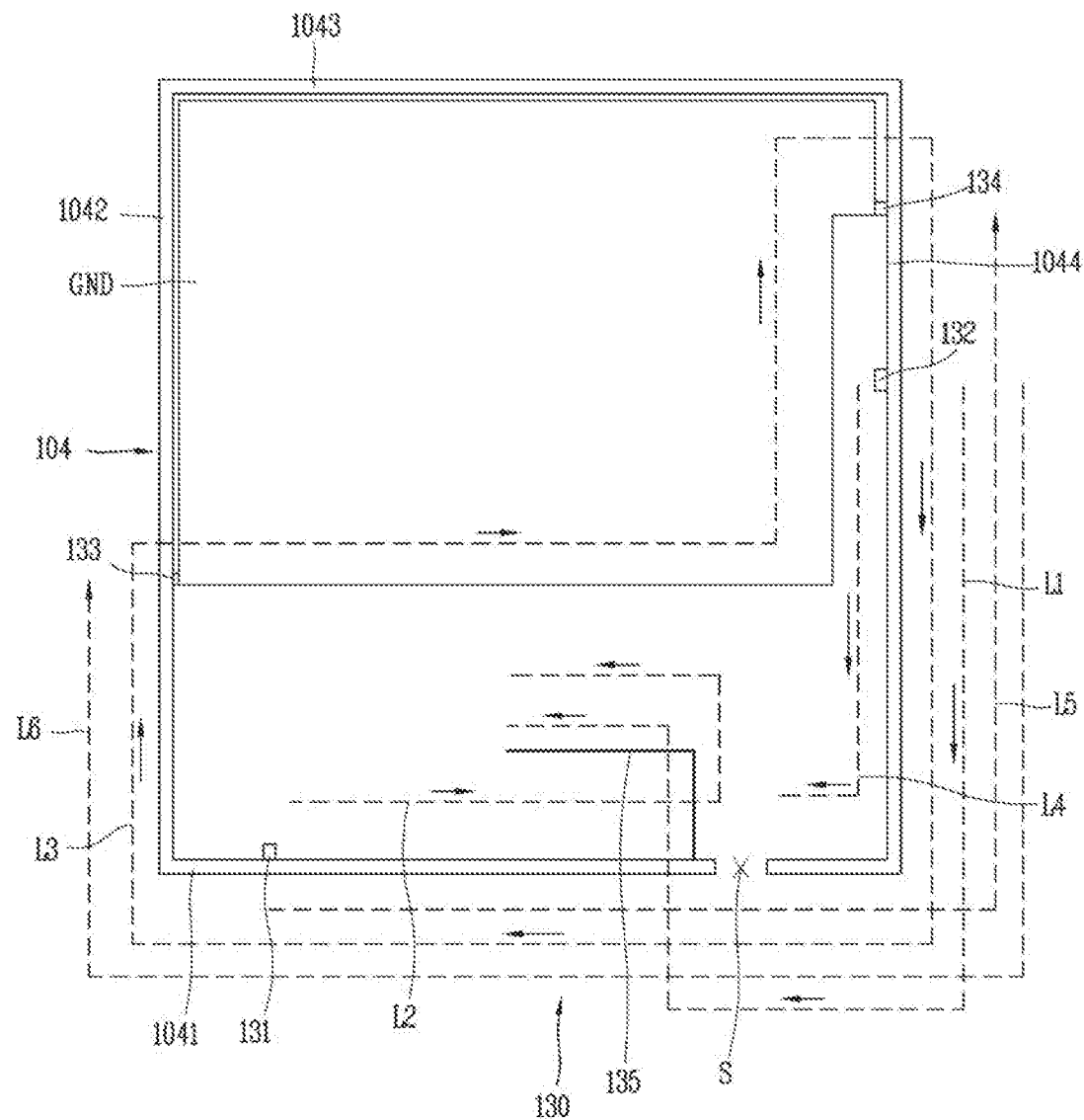
FIG. 16 is a view for explaining an antenna in a mobile terminal according to an embodiment of the present disclosure.

On the other hand, FIG. 16 is a view for explaining the antenna 130 in the mobile terminal 100 according to an embodiment of the present disclosure, and will be described below with reference to FIG. 16. According to an embodiment of the present disclosure, the antenna 130 fed from at least one point of the side case 104 is formed. In other words, power is fed to the side case 104 from one side or both sides with respect to the single slit (S). At this time, the conductive member 135 is connected to the side case 104 to adjust a resonance frequency band. The conductive member 135 may be, for example, a flexible printed circuit board (FPCB), but is not necessarily limited thereto.

Referring to FIG. 16, the side case 104 is made of a metal material, and an intermediate frame 185 or a main circuit board 181 functioning as a ground (GND) is provided inside the side case 104.

The side case 104 includes a first portion 1041 formed at a lower end of the terminal body, a second portion 1042 extended from the first portion 1041 and formed on one side surface of the terminal body, a third portion 1043 extended from the second portion 1042 and formed at an upper end of the terminal body 1043, and a fourth portion 1044 extended from the third portion 1043 and formed on one side surface of the terminal body The first portion 1041 and the third portion 1043 are formed at positions facing each other, and the second portion 1042 and the fourth portion 1044 are also formed at positions facing each other.

Figure 15:
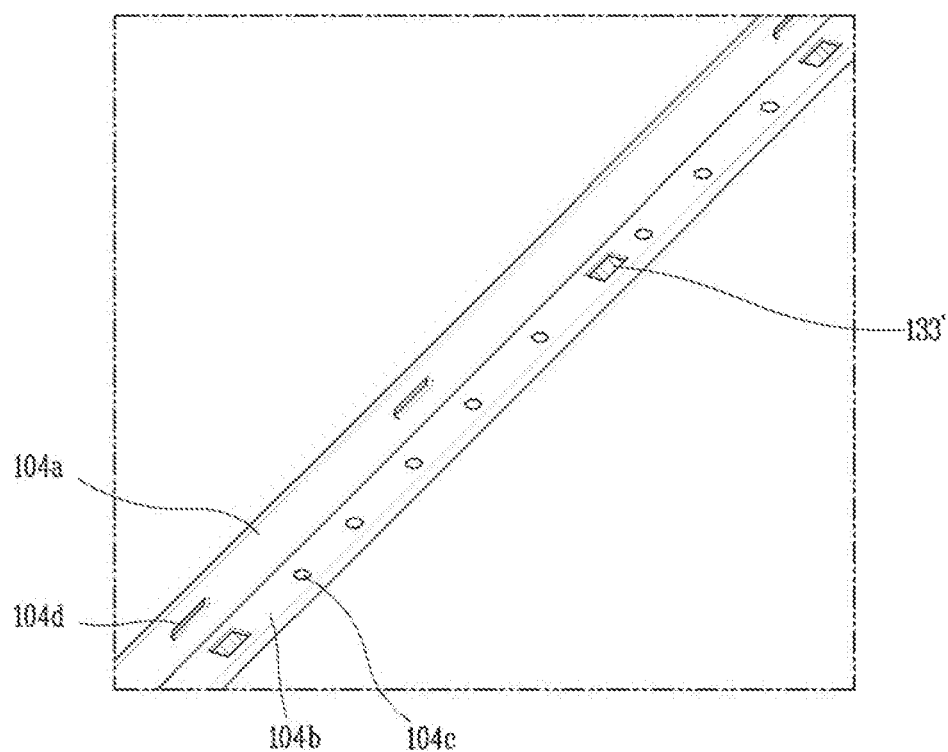
FIG. 15 is a partial perspective view of a side case according to an embodiment of the present disclosure.

Power feeders 131, 132 connected to the main circuit board 181 are formed to flow current through the side case 104 so as to allow the side case 104 to operate as a radiator of the antenna. In other words, according to an embodiment of the present disclosure, the power feeders 131, 132 are formed on one side and the other side of the single slit (S). More specifically, part of a lower end portion of the side case 104 is provided with a first feeder 131, and when power is fed to the first power feeder 131, a conductive loop, which is a current flow, is formed along the side case 104 and an edge of the ground (GND). Furthermore, a first ground portion 133 and a second ground portion 134 are formed at a connection point between the side case 104 and the ground (GND) to flow current to the ground (GND). The first and second ground portions 133, 134 include the first and second ground terminals 183a, 183b described above. The first and second ground portions 133, 134 denote ground portions disposed closest to the first power feeder 131 and the second power feeder 132 among a plurality of ground portions electrically connected between the ground (GND) and the side case 104. Similarly to the first and second ground portions 133, 134, the plurality of ground portions perform a function of grounding the side case 104 and also function as a contact terminal 133' for preventing electric shock. In other words, referring to FIG. 15, an electric shock prevention device 133' is formed at a plurality of points of the side case 104. The electric shock prevention device 133' may have the same configuration as the ground portions 133, 134.

As illustrated in FIG. 16, according to an embodiment of the present disclosure, when the second power feeder 132 is formed at a portion adjacent to the second ground portion 134, a conductive loop by the second feeder 132 is generated. For example, a first conductive loop (L1), which is formed from the second power feeder 132 toward the single slit (S), and through which current flows along the single slit (S) and the conductive member 135 is formed.

Furthermore, a second conductive loop (L2) along which current flows from the first power feeder 131 to the side case 104 and the conductive member 135 may be formed along a counterclockwise direction. At this time, the conductive member 135 is branched from one point of the side case 104 provided between the first power feeder 131 and the single slit (S).

Then, the third conductive loop (L3) is formed on a path passed through the first feeder 131, the first ground portion 133, an edge of the ground (GND), the second ground portion 134, and the second feeder 132, and formed up to the first power feeder 131 through the single slit (S). At this time, the third conductive loop (L3) may be formed in a clockwise or counterclockwise direction along the side case 104, and FIG. 16 illustrates the third conductive loop (L3) formed in a clockwise direction.

In addition, a fourth conductive loop (L4) through which current flows along the second power feeder 132 and part of the side case 104 may be formed along a clockwise direction.

The directions of the first to fourth conductive loops (L1, L2, L3, L4) are not important, but it is important that an electric field due to the flow of current is formed. Such an electric field causes the radiation of the antenna 130.

The conductive member 135 is extended from the side case 104 at a point adjacent to the single slit (S), and the fourth conductive loop (L4) includes a path from the second feeder 132 to one end portion of the side case 104 which forms the single slit (S).

The first through fourth conductive loops (L1, L2, L3, L4) are merely examples, and the present disclosure is not limited thereto, and a power feeder may be additionally disposed to implement a conductive loop capable of implementing various resonance frequencies. As described above, various resonant frequencies may be implemented in an embodiment of the present disclosure.

More specifically, there are a fifth conductive loop (L5) and a sixth conductive loop (L6) illustrated in FIG. 16. The fifth conductive loop (L5) as a conductive loop formed between the first power feeder 131 and the second ground portion 134 passes through the single slit (S), and the sixth conductive loop (L6) as a conductive loop formed between the second power feeder 132 and the first ground portion 133 forms a conductive loop passing through the single slit (S) to implement a different frequency band different from the first through fourth conductive loops (L1, L2, L3, L4).

As described above, an antenna having a plurality of bands may be formed at a lower end of the mobile terminal 100 to reduce the number of antennas provided at an upper end of the mobile terminal 100, thereby having an advantage in that a plurality of frequency bands can be realized with only the single slit (S). For example, an LTE antenna capable of implementing mid-band or high-band frequencies may be disposed at an upper end of the mobile terminal 100.

The foregoing present disclosure may be implemented as codes readable by a computer on a medium written by the program. The computer-readable media includes all types of recording devices in which data readable by a computer system can be stored. Examples of the computer-readable media may include ROM, RAM, CD-ROM, magnetic tape, floppy disk, and optical data storage device, and the like, and also include a device implemented in the form of a carrier wave (for example, transmission via the Internet). In addition, the computer may include the controller 180 of the electronic device. The foregoing embodiments are merely exemplary and are not to be considered as limiting the present disclosure. The scope of the invention should be determined by reasonable interpretation of the appended claims and all changes that come within the equivalent scope of the invention are included in the scope of the invention.

What is claimed is:

1. A mobile terminal, comprising:
    a terminal body;
    a front case formed to cover a front surface of the terminal body;
    a rear case provided on a rear surface of the front case;
    a side case made of a metal material, and integrally formed to form a side appearance of the terminal body, both end portions of which are spaced apart to face each other to form a single slit;
    a main circuit board provided in the terminal body;
    a first power feeder connected to the main circuit board and provided at one side of the single slit to feed power to the side case;
    a second power feeder connected to the main circuit board and provided at the other side of the single slit to feed power to the side case; and
    a conductive member branched from one point between the first power feeder and the single slit, one end portion of which forms a free end,
    wherein a first conductive loop is formed on a path along the side case, the single slit, and the conductive member from the second power feeder, and a second conductive loop is formed on a path along the conductive member through the side case from the first power feeder.

2. The mobile terminal of claim 1, comprising:
    a first ground portion formed adjacent to the first power feeder and grounded to a ground (GND); and
    a second ground portion formed adjacent to the second power feeder and grounded to the ground.

3. The mobile terminal of claim 2, wherein the side case comprises:
    a first portion formed at a lower end of the terminal body;
    a second portion extended from the first portion and formed on one side of the terminal body;
    a third portion extended from the second portion and formed at an upper end of the terminal body; and
    a fourth portion extended from the third portion and formed on one side of the terminal body,
    wherein the single slit and the first power feeder are formed in the first portion, the second power feeder and the second ground portion are formed in the fourth portion, and the first ground portion is formed in the second portion.

4. The mobile terminal of claim 3, further comprising:
    a third conductive loop formed on a path connected to the first power feeder, the single slit and the second ground portion; and
    a fourth conductive loop formed on a path connected to the second power feeder, the single slit, and the first ground portion.

5. The mobile terminal of claim 3, wherein the side case comprises:
    an exposed portion exposed to the outside to form a side appearance of the terminal body; and
    a support portion extended from the exposed portion and inwardly protruded to be coupled to the rear case.

6. The mobile terminal of claim 5, further comprising:
    an intermediate frame made of a metal material provided in the front case;
    a flexible circuit board provided between the intermediate frame and the rear case;
    a first ground terminal formed on one surface of the flexible circuit board, and brought into contact with one surface of the support portion through a through hole formed on the rear case; and
    a second ground terminal formed on the other surface of the flexible circuit board and brought into contact with the intermediate frame.

7. The mobile terminal of claim 6, wherein a protrusion is formed at a position corresponding to the through hole formed on the support portion in the rear case, and the protrusion is passed through the through hole of the support portion and coupled to the support portion by thermal fusion, and
    the rear case is coupled to the support portion by a screw at a portion adjacent to the single slit.

8. The mobile terminal of claim 5, wherein the support portion is cut at a bent portion of the side case.

9. The mobile terminal of claim 1, wherein a plurality of hooks are formed on an outer side surface of the front case, and the hooks are inserted into grooves formed on an inner side surface of the side case to couple the front case to the side case.

10. The mobile terminal of claim 1, wherein the rear case and the front case are fixed to the side case by screws passing through the support portion.

11. The mobile terminal of claim 1, wherein the single slit is an ear jack hole or a USB port.

12. A mobile terminal, comprising:
    a front case in which a display unit is accommodated;
    a rear case provided on a rear surface of the front case;
    a side case configured to form an outer appearance while surrounding a side surface of the rear case;
    a rear cover configured to form a rear appearance while covering a rear surface of the rear case;
    a main circuit board provided between the rear case and the front case;
    a power feeder connected to the main circuit board to feed power to the side case at least one point of the side case; and
    a ground portion formed at least one point of the side case to allow the side case to be grounded to a ground (GND), wherein the side case is an integrally formed metal member, and both end portions thereof are spaced apart from each other to form a single slit at a lower end portion of the side case, and the side case formed adjacent to the single slit operates as a radiator of an antenna having at least one conductive loop by combination with the ground.

13. The mobile terminal of claim 12, wherein the power feeder comprises:
a first power feeder provided on one side of the single slit; and
a second power feeder provided on the other side of the single slit, and
the ground portion comprises:
a first ground portion formed adjacent to the first power feeder and grounded to the ground; and
a second ground portion formed adjacent to the second power feeder and grounded to the ground.

14. The mobile terminal of claim 13, wherein the conductive loop comprises:
a first loop (L1) passed through the first power feeder, the first ground portion, an edge of the ground (GND), the second ground portion and the second power feeder and formed up to the first power feeder through the single slit;
a second loop (L2) passed through the side case from the first power feeder toward the single slit, and formed along a conductive member branched from one point between the first power feeder and the single slit;
a third loop (L3) formed from the second power feeder toward the single slit, and formed along the single slit (S) and the conductive member; and
a fourth loop (L4) formed from the second power feeder to the single slit through the side case.

15. The mobile terminal of claim 14, further comprising:
an intermediate frame made of a metal material provided in the front case, wherein the ground portion comprises:
a flexible circuit board provided between the intermediate frame and the rear case;
a first ground terminal formed on one surface of the flexible circuit board, and brought into contact with one surface of the support portion through a through hole formed on the rear case; and
a second ground terminal formed on the other surface of the flexible circuit board and brought into contact with the intermediate frame.

16. The mobile terminal of claim 14, wherein the side case comprises:
an exposed portion exposed to the outside to form an appearance; and
a support portion extended from the exposed portion and inwardly protruded to be coupled to the rear case.

17. The mobile terminal of claim 16, wherein a protrusion is formed at a position corresponding to the through hole formed on the support portion in the rear case, and the protrusion is passed through the through hole of the support portion and coupled to the support portion by thermal fusion, and
the rear case is coupled to the support portion by a screw at a portion adjacent to the single slit.

18. The mobile terminal of claim 13, wherein the support portion is cut at a bent portion of the side case.

19. The mobile terminal of claim 12, wherein a plurality of hooks are formed on an outer side surface of the front case, and the hooks are inserted into grooves formed on an inner side surface of the side case to couple the front case to the side case.

20. The mobile terminal of claim 12, wherein the rear case and the front case are fixed to the side case by screws passing through the support portion.

21. The mobile terminal of claim 12, wherein the single slit is an ear jack hole.

* * * * *